(12) United States Patent
Hirakata

(10) Patent No.: US 11,394,332 B2
(45) Date of Patent: Jul. 19, 2022

(54) MOTOR DRIVING APPARATUS AND MOTOR DRIVING METHOD

(71) Applicant: FUJI ELECTRIC CO., LTD., Kanagawa (JP)

(72) Inventor: Masaki Hirakata, Hino (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 17/001,585

(22) Filed: Aug. 24, 2020

(65) Prior Publication Data

US 2021/0111656 A1    Apr. 15, 2021

(30) Foreign Application Priority Data

Oct. 11, 2019   (JP) .............................. JP2019-187837

(51) Int. Cl.
| | |
|---|---|
| H02P 6/12 | (2006.01) |
| H02P 27/06 | (2006.01) |
| H02P 29/024 | (2016.01) |
| H02P 23/14 | (2006.01) |
| H02P 6/17 | (2016.01) |
| H02M 1/32 | (2007.01) |
| H03K 5/24 | (2006.01) |
| B60L 3/00 | (2019.01) |
| H02M 1/00 | (2006.01) |

(52) U.S. Cl.
CPC ............ *H02P 27/06* (2013.01); *B60L 3/0061* (2013.01); *H02M 1/32* (2013.01); *H02P 6/12* (2013.01); *H02P 6/17* (2016.02); *H02P 23/14* (2013.01); *H02P 29/027* (2013.01); *H03K 5/24* (2013.01); *H02M 1/0009* (2021.05)

(58) Field of Classification Search
CPC ........ H02P 27/06; H02P 29/027; H02P 23/14; H02P 6/17; H02P 6/12; H02P 29/028; H02P 29/032; H02M 1/32; H03K 5/24; B60L 3/0061
See application file for complete search history.

(56) References Cited

U.S. PATENT DOCUMENTS

| 6,239,566 B1 | 5/2001 | Tareilus |
| 10,507,731 B2 | 12/2019 | Tsukada |
| (Continued) | | |

FOREIGN PATENT DOCUMENTS

| JP | 2000014184 A | 1/2000 |
| JP | 2014138538 A | 7/2014 |
| (Continued) | | |

*Primary Examiner* — Muhammad S Islam

(57) ABSTRACT

Provided is a motor driving apparatus including: an upper-arm gate driving circuit; a lower-arm gate driving circuit; a first rotation detection unit powered by a first power source; a second rotation detection unit powered by a second power source; a first fail safe circuit that performs, by use of a detection signal from the first rotation detection unit, a fail safe control on a gate driving circuit powered at least by the first power source, from among the upper-arm gate driving circuit and the lower-arm gate driving circuit; and a second fail safe circuit that performs, by use of a detection signal from the second rotation detection unit, a fail safe control on a gate driving circuit powered at least by the second power source, from among the upper-arm gate driving circuit and the lower-arm gate driving circuit.

20 Claims, 13 Drawing Sheets

(56) References Cited

U.S. PATENT DOCUMENTS

| | | | |
|---|---|---|---|
| 2014/0307495 A1* | 10/2014 | Fukuta | H02H 3/08 363/98 |
| 2017/0237381 A1 | 8/2017 | Shinohara | |
| 2017/0331400 A1* | 11/2017 | Saha | H02P 6/12 |

FOREIGN PATENT DOCUMENTS

| | | |
|---|---|---|
| JP | 2017147806 A | 8/2017 |
| WO | 2016136815 A1 | 9/2016 |

* cited by examiner

MOTOR DRIVING APPARATUS AND MOTOR DRIVING METHOD

The contents of the following Japanese patent application are incorporated herein by reference:
No. 2019-187837 filed in JP on Oct. 11, 2019

BACKGROUND

1. Technical Field

The present invention relates to a motor driving apparatus and a motor driving method.

2. Related Art

An electromechanical system including a motor and an inverter which drives the motor is used in an electric vehicle such as a hybrid car and an electric car, for example. In such an electromechanical system, an inverter control circuit is typically powered by a vehicle with a power of a low voltage (for example, 12 V). Patent Document 1 discloses a technique for supplying a motor control apparatus with a DC voltage converted from a high voltage power source for driving a motor, in order to control or regulate the motor even if a low voltage power source is lost due to occurrence of a failure. In addition, Patent Documents 1 and 2 disclose a technique for a motor control apparatus which turns on all of upper-arm-side switching devices or all of lower-arm-side switching devices of the inverter to short circuit a motor. In addition, Patent Document 3 discloses a power converter apparatus that alternately turns on all of the upper-arm-side switching devices and all of the lower-arm-side switching devices. In addition, Patent Document 4 discloses a technique for detecting a current that flows through a motor by use of a current that flows through a current detection terminal of a power semiconductor device.

Patent Document 1: Japanese Patent Application Publication No. 2000-14184
Patent Document 2: Japanese Patent Application Publication No. 2017-147806
Patent Document 3: PCT International Publication No. 2016/136815
Patent Document 4: Japanese Patent Application Publication No. 2014-138538

DESCRIPTION OF EXEMPLARY EMBODIMENTS

Hereinafter, the present invention is described through the embodiments of the invention. However, the embodiments described below are not to limit the claimed invention. In addition, all of the combinations of the features described in the embodiments are not necessarily required in the means for solving the problem of the invention.

Figure 1:
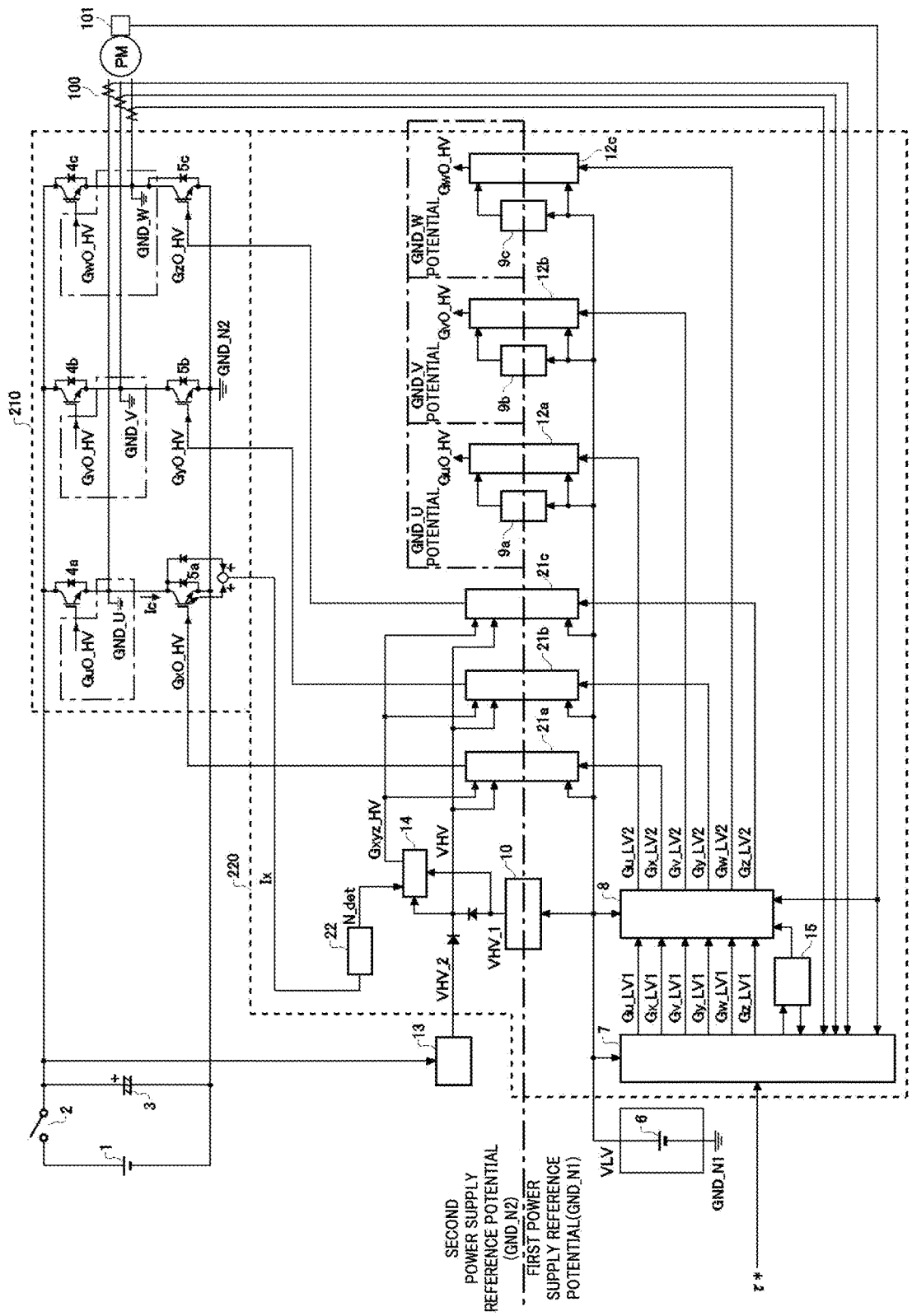
FIG. 1 illustrates a configuration of an electromechanical system according to the present embodiment.

FIG. 1 illustrates a configuration of an electromechanical system 200 according to the present embodiment. The electromechanical system 200 can detect, even when a failure occurs, a rotation speed of a motor PM and determine whether to release the short circuit of the motor or not, in accordance with the rotation speed. This allows the electromechanical system 200 to prevent an unnecessary short circuit of the motor from being continued, thereby preventing occurrence of unnecessary braking due to a regeneration torque and an unnecessary heat generation by the inverter or the motor.

The electromechanical system 200 includes a main battery 1, a switch 2, a DC bus line capacitor 3, an auxiliary battery 6, a motor PM, one or more current sensors 100, a speed sensor 101, an inverter 210, and a motor driving apparatus 220. The main battery 1 is a power source of 400 V, for example, and is connected between the positive side and the negative side of a DC bus line of the inverter 210 to generate a power to be supplied to the motor PM.

The switch 2 is provided between the main battery 1, and the DC bus line capacitor 3 and the inverter 210, to switch such that the main battery 1 is connected to or not connected to the DC bus line capacitor 3 and the inverter 210. As one example, the switch 2 may be switched to an ON state in response to actuation of the electromechanical system 200 or a vehicle on which the electromechanical system 200 is mounted, for example, and switched to an OFF state in response to occurrence of a failure or a malfunction in the electromechanical system 200 or the vehicle on which the electromechanical system 200 is mounted, or to a voltage between the DC bus lines exceeding the upper limit voltage due to regeneration from the motor PM side, for example. In addition, the switch 2 may be switched to the OFF state in response to a power supply from the auxiliary battery 6 being shut off, that is, a voltage supplied from the auxiliary battery 6 falling down to the predetermined lower limit voltage or below, for example.

The DC bus line capacitor 3 is connected between the DC bus lines of the positive side and the negative side, at points closer to the inverter 210 with respect to the switch 2. Here, the main battery 1 and the DC bus line capacitor 3 are one example of the second power source. The DC bus line capacitor 3 stabilizes the voltage on the DC bus line and absorbs a fluctuation of currents supplied to the inverter 210.

The auxiliary battery 6 is a power source of 12 V, for example, and generates a power to be supplied to the motor driving apparatus 220. Here, the auxiliary battery 6 is one example of the first power source. The auxiliary battery 6 may be connected to other equipment (for example, a cell motor and an electrical component) provided in a vehicle on which the electromechanical system 200 is mounted, for example, and may power the equipment. A ground GND_N1 at the negative side of the auxiliary battery 6 may be grounded to the body of the vehicle and is isolated from the main battery 1 and the DC bus line capacitor 3.

The power supply circuit 13 is connected between the DC bus lines and is powered by the DC bus line capacitor 3 to output a power supply voltage VHV_2 which is decreased from the voltage on the DC bus line at the positive side. Here, the power supply voltage VHV_2 refers to the potential of the DC bus line at the negative side (that is, the potential indicated by the ground GND_N2 in the figure) as the reference potential, and may have a potential which is the potential of the ground GND_N2+12 V, for example. The power supply circuit 13 is a DC voltage converter such as a DC/DC converter, for example, and may be non-isolated from the main battery 1 and the DC bus line capacitor 3.

The motor PM is, as one example, a permanent magnet (PM: Permanent Magnet) motor having three phases. Alternatively, the motor PM may also have the different number of phases or may be a motor of other types which is powered to be rotated. In the present embodiment, the motor PM rotates wheels of the vehicle on which the electromechanical system 200 is mounted.

One or more current sensors 100 are provided for some or all of one or more wirings connected to the motor PM to detect a current flowing through the corresponding wiring. The current sensor 100 may be a current sensor of the CT (Current Transformer) type, for example, which measures a current without contacting the wiring subject to measurement. The speed sensor 101 is one example of the first rotation detection unit and is powered by the auxiliary battery 6 to detect a rotation of the motor PM. The speed sensor 101 may be a rotation speed sensor or a rotation angle sensor, for example, which detects an angle of a rotation of the motor PM.

The inverter 210 is connected between the DC bus lines to convert a voltage on the DC bus line into an AC voltage for driving the motor PM (in the present embodiment, a three-phase AC voltage) and supply it to the motor PM. The inverter 210 includes, correspondingly to each phase of the motor PM, each of a plurality of upper-arm-side switching devices 4a-c (hereinafter also referred to as the "upper-arm-side switching device 4") and each of a plurality of lower-arm-side switching devices 5a-c (hereinafter also referred to as the "lower-arm-side switching device 5"). Each upper-arm-side switching device 4 and each lower-arm-side switching device 5 may be a power semiconductor device and are, as one example, an IGBT (isolated gate bipolar transistor) having a collector and an emitter as main terminals and having a gate as a control terminal. Alternatively, each upper-arm-side switching device 4 and each lower-arm-side switching device 5 may be an MOSFET having a drain and a source as main terminals and having a gate as a control terminal.

The upper-arm-side switching device 4a and the lower-arm-side switching device 5a are connected with each other at their main terminals in series between the DC bus line at the positive side and the DC bus line at the negative side in parallel with the DC bus line capacitor 3, and a first phase terminal (U-phase terminal) of the motor PM is connected between the upper-arm-side switching device 4a and the lower-arm-side switching device 5a. The main terminals of the upper-arm-side switching device 4b and the lower-arm-side switching device 5b and those of the upper-arm-side switching device 4c and the lower-arm-side switching device 5c are connected between the DC bus lines in the same manner as those of the upper-arm-side switching device 4a and the lower-arm-side switching device 5a, respectively, and a second phase terminal (V-phase terminal) of the motor PM is connected between the upper-arm-side switching device 4b and the lower-arm-side switching device 5b while a third phase terminal (W-phase terminal) of the motor PM is connected between the upper-arm-side switching device 4c and the lower-arm-side switching device 5c.

Each upper-arm-side switching device 4 and each lower-arm-side switching device 5 may have a free wheel diode connected to the body of the switching device in a reverse direction. Here, if each upper-arm-side switching device 4 and each lower-arm-side switching device 5 are MOSFETs, the free wheel diode may also be a parasitic diode.

At least one of each upper-arm-side switching device 4 and each lower-arm-side switching device 5 include a current detection terminal. In the present embodiment, one of the lower-arm-side switching devices (for example, the lower-arm-side switching device 5a) includes a current detection terminal. The current detection terminal drives a small amount of currents for current detection in accordance with currents flowing between the main terminals. For example, an IGBT may have a sense emitter terminal for detecting a current flowing through the IGBT. Such a sense emitter terminal may be used as a current detection terminal.

Here, if the switching devices are off, the lower-arm-side switching device 5a subject to current detection allows a current to flow through the free wheel diode from the DC bus line at the negative side to the motor PM, although it does not allow a current to flow through the body of the switching device. Thus, in the present embodiment, the lower-arm-side switching device 5a includes a small-sized current detection diode in parallel with the free wheel diode, and includes a terminal which connects the sense emitter terminal with an anode of the current detection diode, as a current detection terminal. Such a current detection terminal allows a current to flow therethrough, which is a current flowing through the sense emitter terminal of the lower-arm-side switching device 5a merged with a current flowing through the current detection diode, that is, a sense current in accordance with currents flowing through the entire lower-arm-side switching device including the free wheel diode. Note that a sense current may occur in proportion to currents which flow through the entire lower-arm-side switching device to some degree in the steady state, but is not necessarily in proportion thereto in the transient state. The inverter 210 conveys a current detection signal in accordance with such a sense current to the motor driving apparatus 220. As one example, the current detection signal is a signal obtained by driving the sense current to flow through a sense resistor having a predetermined resistance value and having a voltage in accordance with the sense current. Note that the lower-arm-side switching device 5a may be designed such that the ratio between a current of the free wheel diode and a current flowing through the current detection diode is substantially the same as the ratio between a current flowing through the emitter of the body of the switching device and a current flowing through the sense emitter.

The motor driving apparatus 220 is connected to the inverter 210, and is powered by the power supply circuit 13 and the auxiliary battery 6 to control the inverter 210. The motor driving apparatus 220 includes a control circuit 7, a first fail safe circuit 8, a failure detection circuit 15, a plurality of upper-arm power supply circuits 9a-c, a plurality of upper-arm gate driving circuits 12a-c, a lower-arm power supply circuit 10, a power supply circuit 13, a speed detection unit 22, a second fail safe circuit 14 and a plurality of gate driving circuits 21a-c.

The control circuit 7 refers to a potential of the ground GND_N1 at the negative side of the auxiliary battery 6 as the reference potential and is powered by the auxiliary battery 6. The control circuit 7 may be embodied by a CPU such as a micro controller or a processor for controlling the motor, or a computer including a CPU, for example. Alternatively, the control circuit 7 may also be embodied by a hardware circuit. The control circuit 7 receives a torque instruction τ* which indicates a torque for driving the motor PM, from a computer of the vehicle (not illustrated in the figure), such as an ECU (Electric Control Unit), and generates and outputs gate driving instructions Gu_LV1, Gv_LV1, Gw_LV1, Gx_LV1, Gy_LV1, and Gz_LV1 to drive the motor PM to generate a torque in accordance with the torque instruction τ*. Gu_LV1, Gv_LV1, Gw_LV1, Gx_LV1, Gy_LV1, and Gz_LV1 are the gate driving instructions which correspond to the upper-arm-side switching device 4a, the upper-arm-side switching device 4b, the upper-arm-side switching device 4c, the lower-arm-side switching device 5a, the lower-arm-side switching device 5b, and the lower-arm-side switching device 5c, respectively. In the present embodiment, the control circuit 7 outputs the gate driving instruction to instruct the inverter 210 to generate a three phase AC current for rotating the motor PM with the torque indicated by the torque instruction τ*.

The first fail safe circuit 8 refers to the potential of the ground GND_N1 as the reference potential and is powered at least by the auxiliary battery 6. In the present embodiment, the first fail safe circuit 8 is powered by the auxiliary battery 6, but not powered by the main battery 1 or the DC bus line capacitor 3. The first fail safe circuit 8 performs, by use of the detection signal from the speed sensor 101, a fail safe control on the gate driving circuit powered at least by the auxiliary battery 6, from among the upper-arm gate driving circuits 12a-c and the gate driving circuits 21a-c. In the present embodiment, the first fail safe circuit 8 performs a fail safe control on the upper-arm gate driving circuits 12a-c powered by the speed sensor 101. In the present embodiment, the gate driving circuits 21a-c are also powered by the speed sensor 101. Therefore, the first fail safe circuit 8 also performs a fail safe control on the gate driving circuits 21a-c.

Specifically, the first fail safe circuit 8 receives the gate driving instructions Gu_LV1, Gv_LV1, Gw_LV1, Gx_LV1, Gy_LV1, and Gz_LV1 input from the control circuit 7, and outputs gate driving instructions Gu_LV2, Gv_LV2, Gw_LV2, Gx_LV2, Gy_LV2, and Gz_LV2, without values of the gate driving instructions Gu_LV1, Gv_LV1, Gw_LV1, Gx_LV1. Gy_LV1, and Gz_LV1 being unchanged in the normal operation. This allows the inverter 210 to drive the motor PM in response to the control by the control circuit 7. In the fail safe operation, if the rotation speed of the motor PM is equal to or greater than the threshold, the first fail safe circuit 8 may perform a fail safe control on the inverter 210, including at least one of: turning all of the upper-arm-side switching devices 4a-c in the ON state, and turning all of the lower-arm-side switching devices 5a-c in the ON state.

The failure detection circuit 15 is connected to the control circuit 7 and powered by the auxiliary battery 6. The failure detection circuit 15 monitors the control circuit 7 to detect a failure or a malfunction of the control circuit 7, and resets and restarts the control circuit 7 in accordance with a type of the failure or the malfunction. In addition, depending on the type of the failure or the malfunction, the failure detection circuit 15 instructs the first fail safe circuit 8 to perform the fail safe control.

Each of the upper-arm power supply circuits 9a-c is powered by the auxiliary battery 6 to convert the power supply voltage from the auxiliary battery 6 into a power supply voltage for controlling each of the upper-arm-side switching devices 4a-c. Here, the upper-arm power supply circuit 9a outputs a voltage which refers to the main terminal of the upper-arm-side switching device 4a at the side of the lower-arm-side switching device 5a (the emitter terminal of the upper-arm-side switching device 4a in the present embodiment) as the reference potential (ground GND_U), as a power supply voltage for controlling the upper-arm-side switching device 4a (for example, the potential of GND_U+ 12 V). The upper arm power supply circuit 9b outputs a voltage which refers to the ground GND_V as the reference potential, as a power supply voltage for controlling the upper-arm-side switching device 4b. The upper arm power supply circuit 9c outputs a voltage which refers to the ground GND_W as the reference potential, as a power supply voltage for controlling the upper-arm-side switching device 4c. Each of the upper-arm power supply circuits 9a-c may be, as one example, an isolated DC/DC converter including an isolation transformer.

The upper-arm gate driving circuits 12a-c is connected to the first fail safe circuit 8 and powered by the auxiliary battery 6 and the upper-arm power supply circuits 9a-c. Then, the upper-arm gate driving circuits 12a-c drives the gates of the upper-arm-side switching devices 4a-c based on the gate driving instructions from the first fail safe circuit 8. More specifically, the upper-arm gate driving circuit 12a includes an isolation device such as a photocoupler which transmits a signal while providing electrical isolation, boosts the gate driving instruction Gu_LV2 which refers to the reference potential of the auxiliary battery 6 (ground GND_N1) as the reference potential, up to a gate driving instruction GuO_HV which refers to the ground GND_U as the reference potential, and outputs it to the gate of the upper-arm-side switching device 4a. The upper-arm gate driving circuit 12b and the upper-arm gate driving circuit 12c operate in the same manner.

The lower-arm power supply circuit 10 is powered by the auxiliary battery 6 and converts the power supply voltage of the auxiliary battery 6 which refers to ground GND_N1 as the reference potential, into a power supply voltage $\overline{VHV\_1}$ which refers to the ground GND_N2 as the reference potential (for example, the potential of the ground GND_N2+12 V). The lower-arm power supply circuit 10 may be an isolated DC/DC converter including an isolation transformer.

The power supply voltage VHV_1 from the lower-arm power supply circuit 10 and the power supply voltage VHV_2 from the power supply circuit 13 are merged, for example, through rectifier devices such as rectifier diodes, respectively, to be a power supply voltage VHV. This allows the power supply voltage VHV to be redundant so as not to be lost even if either the power supply voltage VHV_1 or the power supply voltage VHV_2 is lost.

The speed detection unit 22 is one example of the second rotation detection unit, and is powered at least by the second power source to detect a rotation of the motor PM. The speed detection unit 22 is powered by the power supply voltage VHV to detect a rotation of the motor PM based on the current detection signal from the current detection terminal of the upper-arm-side switching device 4 or the lower-arm-side switching device 5. In the present embodiment, the speed detection unit 22 outputs a detection signal N_det in accordance with a rotation speed of the motor based on the current detection signal from the current detection terminal of the lower-arm-side switching device 5a.

The second fail safe circuit 14 is connected to the speed detection unit 22 and powered at least by the second power source. In the present embodiment, the second fail safe circuit 14 is powered by the power supply voltage VHV. The second fail safe circuit 14 performs, by use of the detection signal N_det from the speed detection unit 22, a fail safe control on a gate driving circuit at least powered by the power supply circuit 13 (the gate driving circuits 21a-c in the present embodiment), from among the upper-arm gate driving circuits 12a-c and the gate driving circuits 21a-c.

In the present embodiment, the second fail safe circuit 14 receives the power supply voltage VHV_1 input from the lower-arm power supply circuit 10 to detect that a power supply from the auxiliary battery 6 is lost, in response to the power supply voltage VHV_1 falling down to the lower limit voltage or below. Then, the second fail safe circuit 14 performs, if a power supply from the auxiliary battery 6 is lost, a fail safe control on the gate driving circuits 21a-c powered by the DC bus line capacitor 3 through the power supply circuit 13. In the present embodiment, the second fail safe circuit 14 sets the gate driving instruction Gxyz_HV to be logic L (low) during the normal operation. In the fail safe control, if the rotation speed of the motor PM is equal to or greater than the threshold, the second fail safe circuit 14 sets the gate driving instruction Gxyz_HV to be logic H (high) and turns on all of the lower-arm-side switching devices 5a-c.

The gate driving circuits 21a-c are connected to the first fail safe circuit 8 and the second fail safe circuit 14, and powered by the auxiliary battery 6 and the power supply voltage VHV. Then, the gate driving circuits 21a-c function as the lower-arm gate driving circuit to drive the gates of the lower-arm-side switching devices 5a-c based on the gate driving instructions from the first fail safe circuit 8 and the second fail safe circuit 14. The gate driving circuit 21a switches the lower-arm-side switching device 5a between on and off based on the gate driving instruction Gx_LV2 from the first fail safe circuit 8, if the gate driving instruction Gxyz_HV from the second fail safe circuit 14 is logic L, and outputs to the lower-arm-side switching device 5a a gate driving instruction GxO_HV to turn on the lower-arm-side switching device 5a, if the gate driving instruction Gxyz_HV is logic H. Here, the gate driving instruction GxO_HV is a signal which refers to the reference potential of the main battery 1 and the DC bus line capacitor 3 (ground GND_N2) as the reference potential. The speed detection unit 22b and the speed detection unit 22c have similar functions.

According to the electromechanical system 200 described above, the upper-arm gate driving circuits 12a-c and the speed sensor 101 are powered by the auxiliary battery 6, but not powered by the power supply circuit 13. On the other hand, the speed detection unit 22, the second fail safe circuit 14, and the gate driving circuits 21a-c are powered by the power supply circuit 13. This allows the electromechanical system 200 to perform a fail safe control by the speed detection unit 22 and the second fail safe circuit 14 which are powered by the power supply circuit 13, even if the loss of the auxiliary battery 6 disables the upper-arm gate driving circuits 12a-c to operate and the speed sensor 101 to detect the rotation speed.

In addition, the lower-arm power supply circuit 10 and the power supply circuit 13 power the speed detection unit 22, the second fail safe circuit 14, and the gate driving circuits 21a-c, while they do not power the control circuit 7, the first fail safe circuit 8, the upper-arm gate driving circuits 12a-c, or the failure detection circuit 15. Therefore, the maximum output powers of the lower-arm power supply circuit 10 and the power supply circuit 13 can be reduced, which allows the lower-arm power supply circuit 10 and the power supply circuit 13 to be miniaturized.

Note that, in the present embodiment, the power source for the circuit portions which control the lower-arm-side switching devices 5a-c is made redundant by the power supply circuit 13 and the auxiliary battery 6. Alternatively, the auxiliary battery 6 can be configured not to power the circuit portions which control the lower-arm-side switching devices 5a-c. In this case, the electromechanical system 200 may perform a fail safe control on the upper-arm-side switching devices 4a-c if a power supply from the auxiliary battery 6 is lost, and may perform a fail safe control on the lower-arm-side switching devices 5a-c if a power supply from the main battery 1 and the DC bus line capacitor 3 is lost. In addition, instead of making the power source for the circuit portions which control the lower-arm-side switching devices 5a-c redundant, the power source for the circuit portions which control the upper-arm-side switching devices 4a-c may be made redundant such that the speed detection unit 22 and the second fail safe circuit 14 are used to control the upper-arm gate driving circuits 12a-c.

Figure 2:
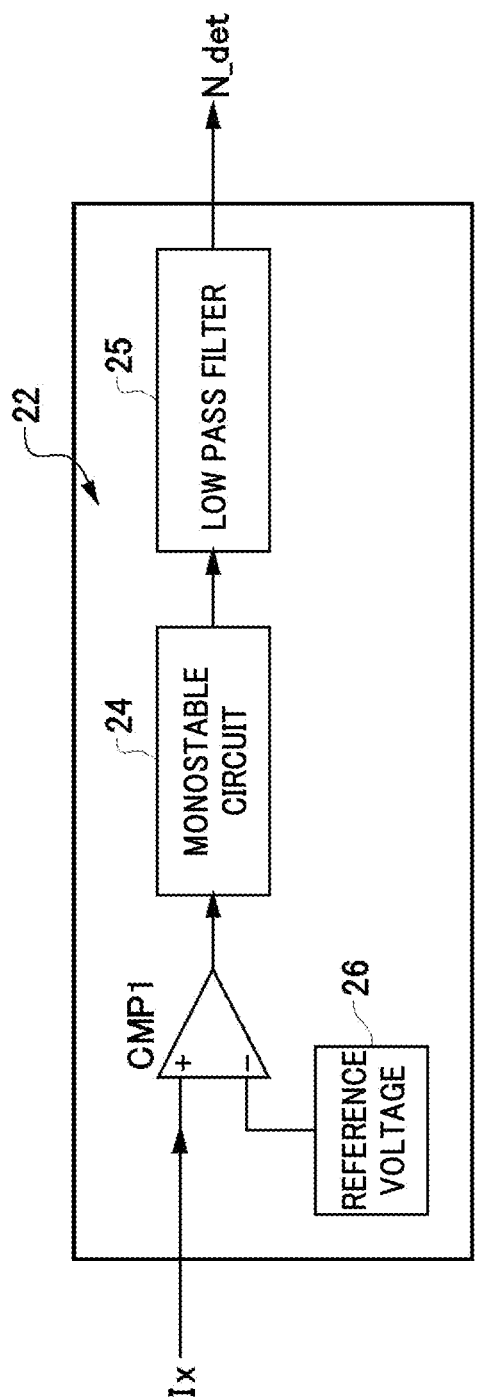
FIG. 2 illustrates one example of the configuration of a speed detection unit according to the present embodiment.

FIG. 2 illustrates one example of a configuration of the speed detection unit 22 according to the present embodiment. The speed detection unit 22 includes a reference voltage source 26, a comparator CMP1, a monostable circuit 24, and a low pass filter 25. The reference voltage source 26 generates a reference voltage to be compared with a voltage value of a current detection signal Ix from the current detection terminal of the lower-arm-side switching device 5a. In the present embodiment, the current detection signal Ix has a voltage value in accordance with the sum of currents flowing through the body of the switching device of the lower-arm-side switching device 5a and the free wheel diode and represents a signal of a sinusoidal wave form having a period in accordance with a rotation period of the motor PM. In order to detect a frequency of such a signal, the reference voltage source 26 generates, as one example, a voltage of 0 V, or a voltage with a predetermined small margin subtracted from 0 V.

The comparator CMP1 compares the current detection signal Ix with the reference voltage generated by the reference voltage source 26 to output a logic signal in accordance with the result of comparison. As the current detection signal Ix has a period in accordance with the rotation period of the motor PM, the comparator CMP1 outputs a logic signal having a period including a duration of logic H and a duration of logic L per each rotation period of the motor PM. Note that the comparator CMP1 may have a hysteresis.

The monostable circuit 24 generates, triggered by the logic signal output by the comparator CMP1, a pulse signal including a pulse having a width determined in accordance with the design of the monostable circuit 24. In the present embodiment, the monostable circuit 24 generates a pulse signal, triggered by a downwardly falling edge of the logic signals (a change from logic H to logic L) output by the comparator CMP1.

The low pass filter 25 generates a detection signal N_det in accordance with a density of pulses in the pulse signal (that is, the ratio of the duration of logic H) output by the monostable circuit 24. Specifically, the pulse signal output by the monostable circuit 24 includes a pulse having a predetermined width for each period in accordance with the rotation period of the motor PM. Therefore, the ratio of the duration of logic H is higher if the rotation period of the motor PM is smaller (that is, the rotation speed of the motor PM is larger), while the ratio of the duration of logic H is smaller if the rotation period of the motor PM is larger (that is, the rotation speed of the motor PM is smaller). The low pass filter 25 smooths such a pulse signal so that it outputs the detection signal N_det which represents a larger value (voltage value, as one example) if the rotation speed of the motor PM is larger, and represents a smaller value if the rotation speed of the motor PM is smaller.

Figure 3:
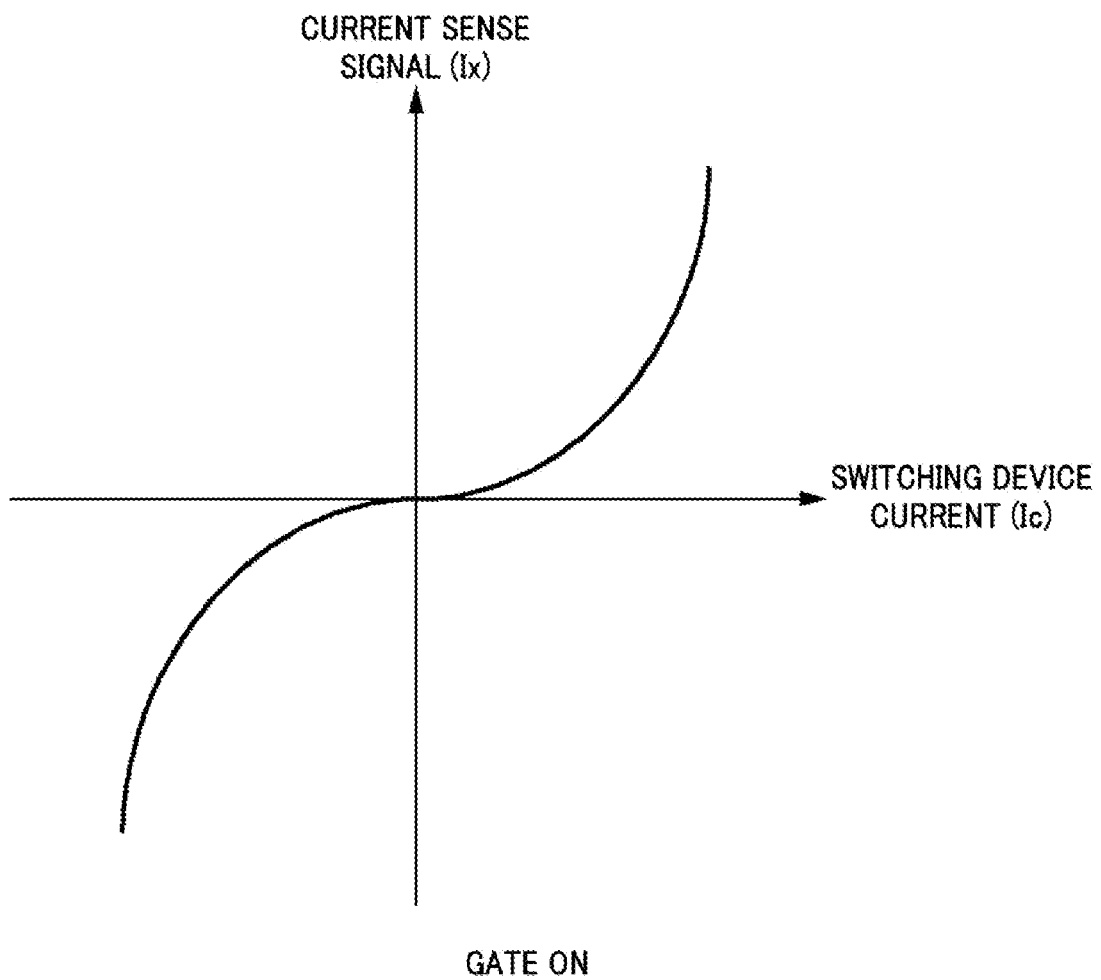
FIG. 3 illustrates one example of output characteristics of the current detection terminal of the switching device in the ON state.

FIG. 3 illustrates one example of output characteristics of the current detection terminal of the switching device in the ON state. If the lower-arm-side switching device 5a is on, the lower-arm-side switching device 5a may allow a current to flow in any directions, a direction from the DC bus line at the negative side to the motor PM and a direction from the motor PM to the DC bus line at the negative side. Accordingly, the current detection signal (current sense signal in the figure) represents a positive or negative value depending on whether the current Ic allowed to flow by the lower-arm-side switching device 5a is positive or negative.

Figure 4:
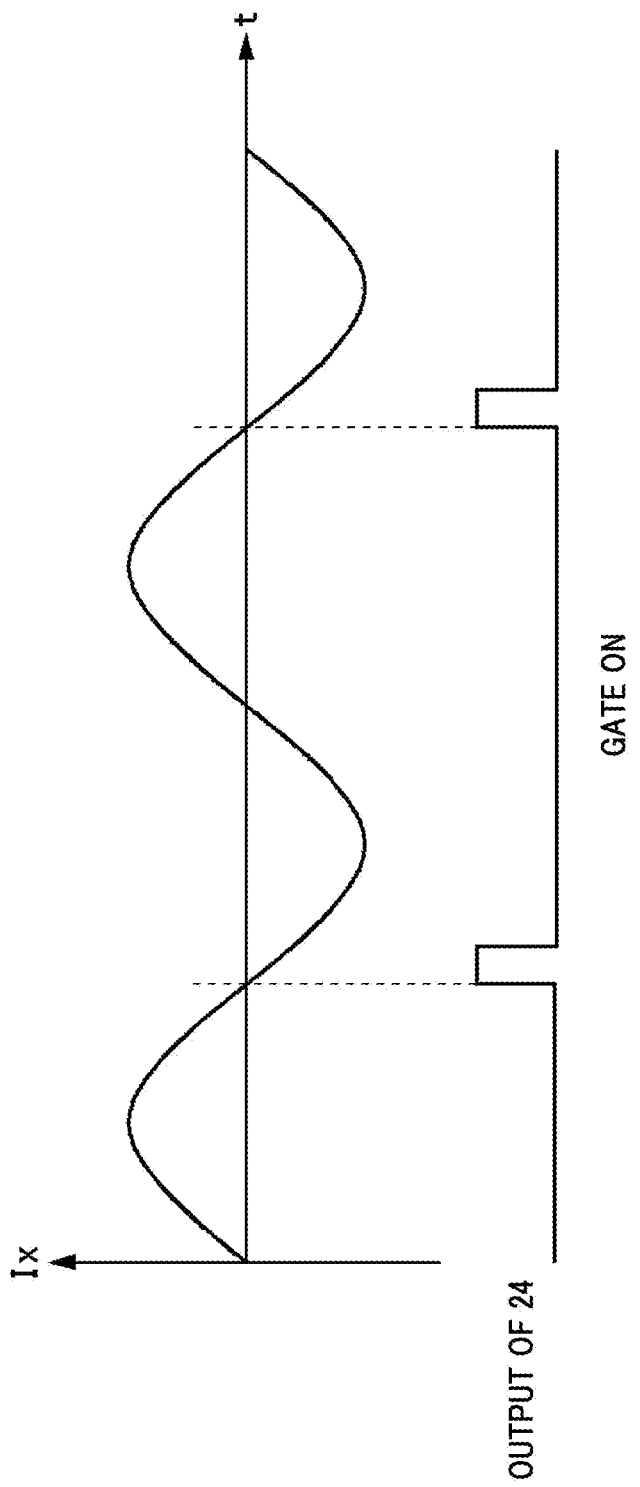
FIG. 4 illustrates one example of a speed detection method of the switching device in the ON state.

FIG. 4 illustrates one example of a speed detection method of the switching device in the ON state. If the lower-arm-side switching device 5a is on, the current detection signal Ix changes between positive and negative to represent a signal of a sinusoidal wave form having a period in accordance with the rotation speed of the motor PM as illustrated in the graph at the upper side in FIG. 4. If the reference voltage source 26 generates the reference voltage of 0 V, the comparator CMP1 outputs a logic signal of logic H if the current detection signal Ix is positive (if it exceeds 0 V), and of logic L if the current detection signal Ix is negative or 0 (if it is 0 V or less). The monostable circuit 24 generates, as illustrated in the graph at the lower side in FIG. 4, a pulse having a fixed width at a downwardly falling edge of this logic signal (that is, a timing at which the current detection signal Ix changes from positive to negative). The low pass filter 25 smooths the pulse signal including such pulses so that it generates the detection signal N_det in accordance with the rotation speed of the motor PM.

Figure 5:
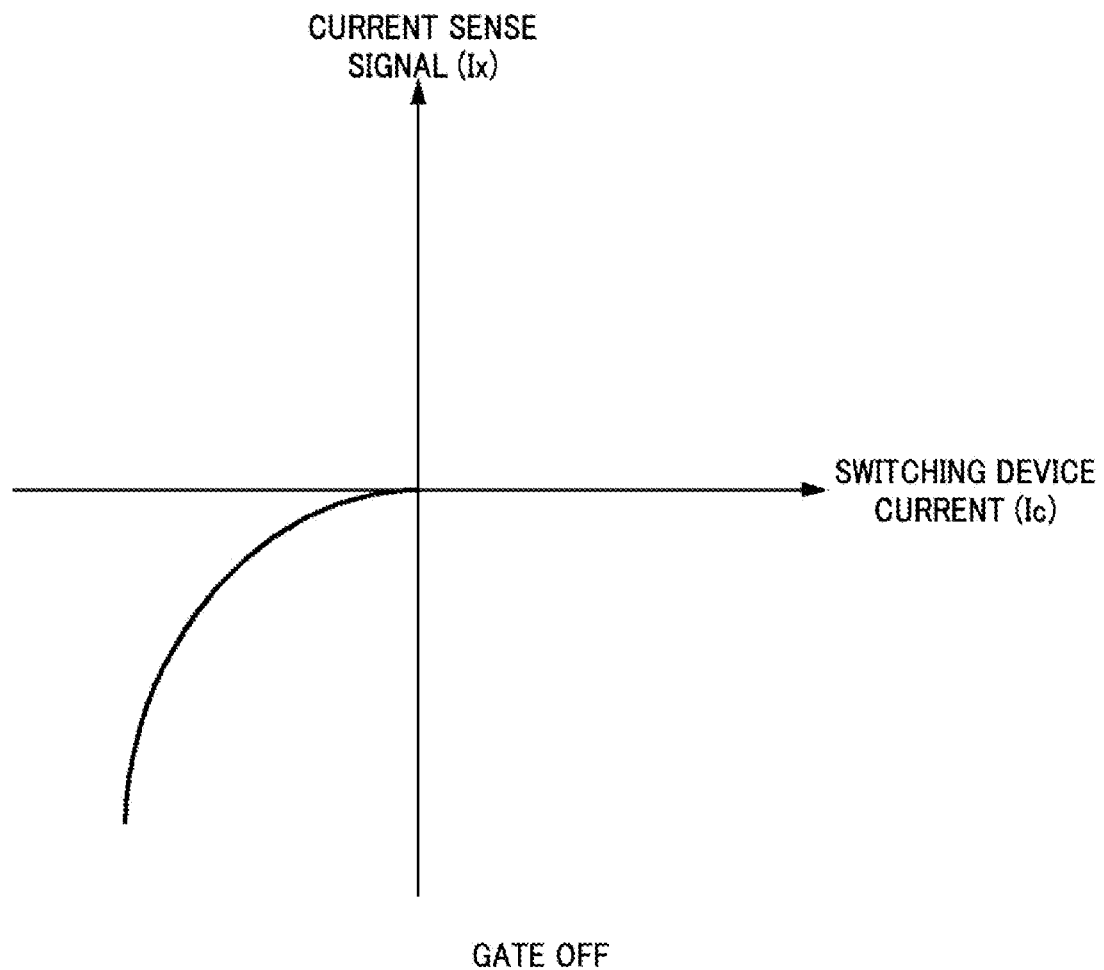
FIG. 5 illustrates one example of output characteristics of the current detection terminal of the switching device in the OFF state.

FIG. 5 illustrates one example of output characteristics of the current detection terminal of the switching device in the OFF state. If the lower-arm-side switching device 5a is off, the lower-arm-side switching device 5a allows a current in the direction from the DC bus line at the negative side to the motor PM to flow through the free wheel diode and the current detection diode, while shutting off a current in the direction from the motor PM to the DC bus line at the negative side. Accordingly, the current detection signal (current sense signal in the figure) represents a negative value, but does not represent a positive value, if the current Ic allowed to flow by the lower-arm-side switching device 5a is negative.

Figure 6:
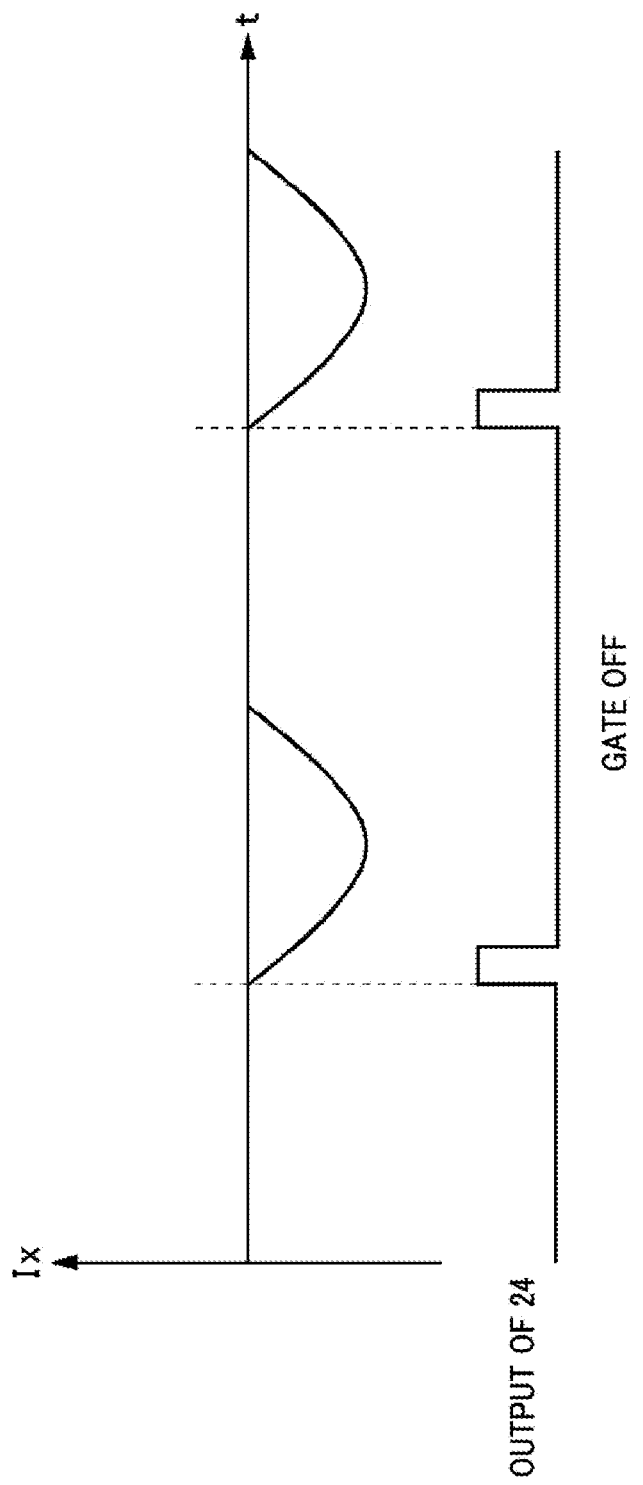
FIG. 6 illustrates one example of the speed detection method of the switching device in the OFF state.

FIG. 6 illustrates one example of the speed detection method of the switching device in the OFF state. If the lower-arm-side switching device 5a is off, the current detection signal Ix is not positive, and represents, as illustrated in the graph at the upper side in FIG. 6, a signal of a sinusoidal wave form having a period in accordance with the rotation speed of the motor PM and having the upper limit restricted up to 0 or less. If the reference voltage source 26 generates the reference voltage with a margin being subtracted from 0 V, the comparator CMP1 outputs a logic signal which is logic H if the current detection signal Ix is approximately 0 V and is logic L if the current detection signal Ix is negative. The monostable circuit 24 generates, as illustrated in the graph at the lower side in FIG. 6, a pulse having a fixed width at a downwardly falling edge of the logic signal (that is, a timing at which the current detection signal Ix changes from 0 to negative, exceeding the margin). The low pass filter 25 smooths the pulse signal including such a pulse so that it generates the detection signal N_det in accordance with the rotation speed of the motor PM. Note that, if the reference voltage source 26 generates the reference voltage with the margin subtracted from 0 V, the speed detection unit 22 can detect the rotation speed of the motor PM, irrespective of whether the lower-arm-side switching device 5a is on or off.

Note that, a device not including a small-sized current detection diode in parallel with the free wheel diode may also be used as the lower-arm-side switching device 5a. In such a configuration, if the lower-arm-side switching device 5a is off, a current which flows through the lower-arm-side switching device 5a cannot be detected. In addition, if the lower-arm-side switching device 5a is on, a current which flows from the motor PM to the DC bus line at the negative side (positive current Ic) can be detected, while the current which flows from the DC bus line at the negative side to the motor PM (negative current Ic) can only be detected in part, except for a portion of the current which flows through the free wheel diode. Therefore, the speed detection unit 22 may configure the reference voltage source 26 to output a voltage of 0 V plus a positive margin, for example, so that the monostable circuit 24 can generate a pulse signal based on a signal waveform of a portion of 0 or above of the signal waveform of the current detection signal Ix. Note that, even if the portion of the current which flows through the free wheel diode cannot be detected, if it can correctly be detected whether a current which flows through the lower-arm-side switching device 5a is positive or negative, the speed detection unit 22 may configure the monostable circuit 24 to generate the pulse signal at a timing when the current detection signal Ix changes from negative to positive, for example.

Figure 7:
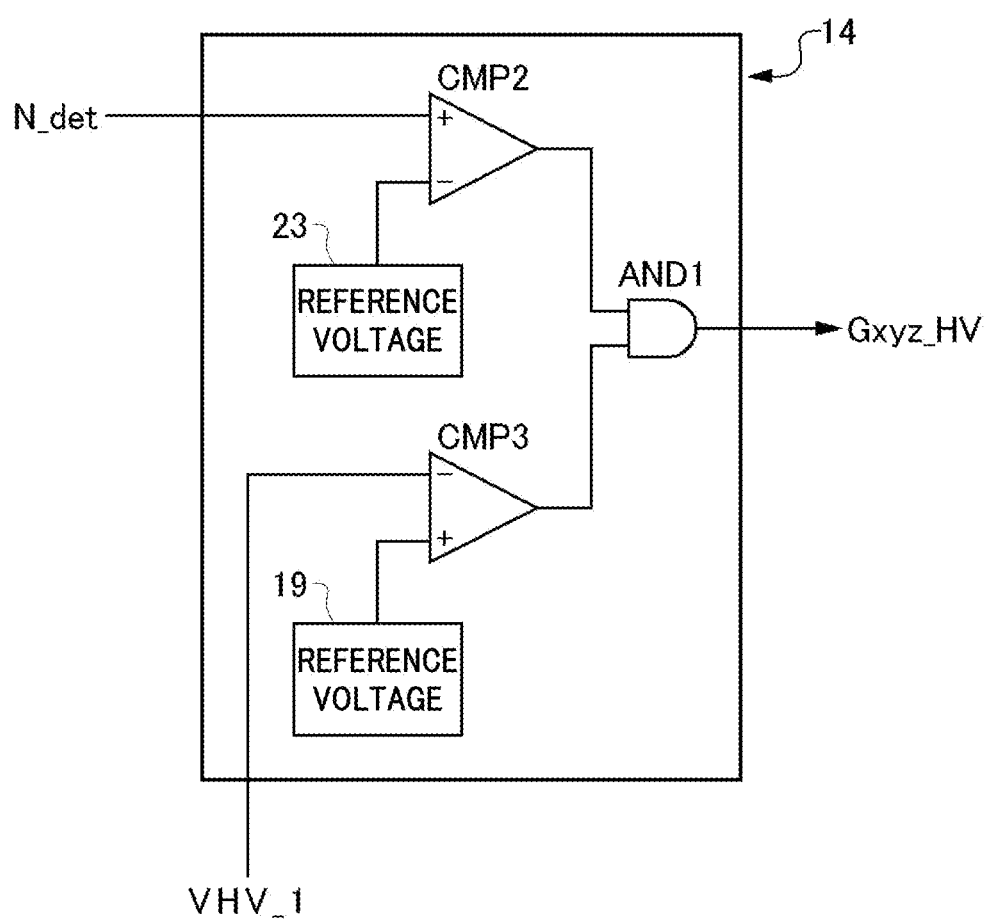
FIG. 7 illustrates one example of the second fail safe circuit according to the present embodiment.

FIG. 7 illustrates one example of the second fail safe circuit 14 according to the present embodiment. The second fail safe circuit 14 includes a reference voltage source 23, a comparator CMP2, a reference voltage source 19, a comparator CMP3, and a logic product device AND1.

The reference voltage source 23 generates the reference voltage. In the present embodiment, the reference voltage source 23 generates a threshold voltage Vth of the detection signal N_det set in accordance with a rotation speed Vsafe which is the lower limit of the rotation speed of the motor PM for performing the fail safe control. The comparator CMP2 has a positive input terminal (non inverting input terminal) which is connected to the speed detection unit 22 and receives the detection signal N_det input thereto, and a negative input terminal (inverting input terminal) which receives the reference voltage of the reference voltage source 23 of the comparator CMP2 input thereto. This allows the comparator CMP2 to output logic L if the detection signal N_det is equal to or less than the threshold voltage Vth, and logic H if it exceeds the threshold voltage Vth. Note that the comparator CMP2 may also have a hysteresis.

The reference voltage source 19 generates the reference voltage. In the present embodiment, the reference voltage source 19 generates the threshold voltage used as the reference for determining whether the auxiliary battery 6 is in the normal operation or not. The comparator CMP3 has a negative input terminal (inverting input terminal) which receives the power supply voltage VHV_1 input from the lower-arm power supply circuit 10, and a positive input terminal (non inverting input terminal) which receives the reference voltage of the reference voltage source 19 input thereto. This allows the comparator CMP3 to output logic L if the power supply voltage VHV_1 is higher than the threshold voltage, and logic H if the power supply voltage VHV_1 is equal to or less than the threshold voltage (that is, if it is determined that the auxiliary battery 6 is lost). Note that the comparator CMP3 may also have a hysteresis.

The logic product device AND1 outputs a gate driving signal Gxyz_HV of logic H if both of an output of the comparator CMP2 and an output of the comparator CMP3 are logic H (that is, if exceeding the threshold for determining logic H). This allows the second fail safe circuit 14 sets the gate driving signal Gxyz_HV to be logic H in order to perform a fail safe control by turning on all of the lower-arm-side switching devices 5a-c, in response to the auxiliary battery 6 being lost and the rotation speed of the motor PM exceeding the predetermined lower limit value.

Figure 8:
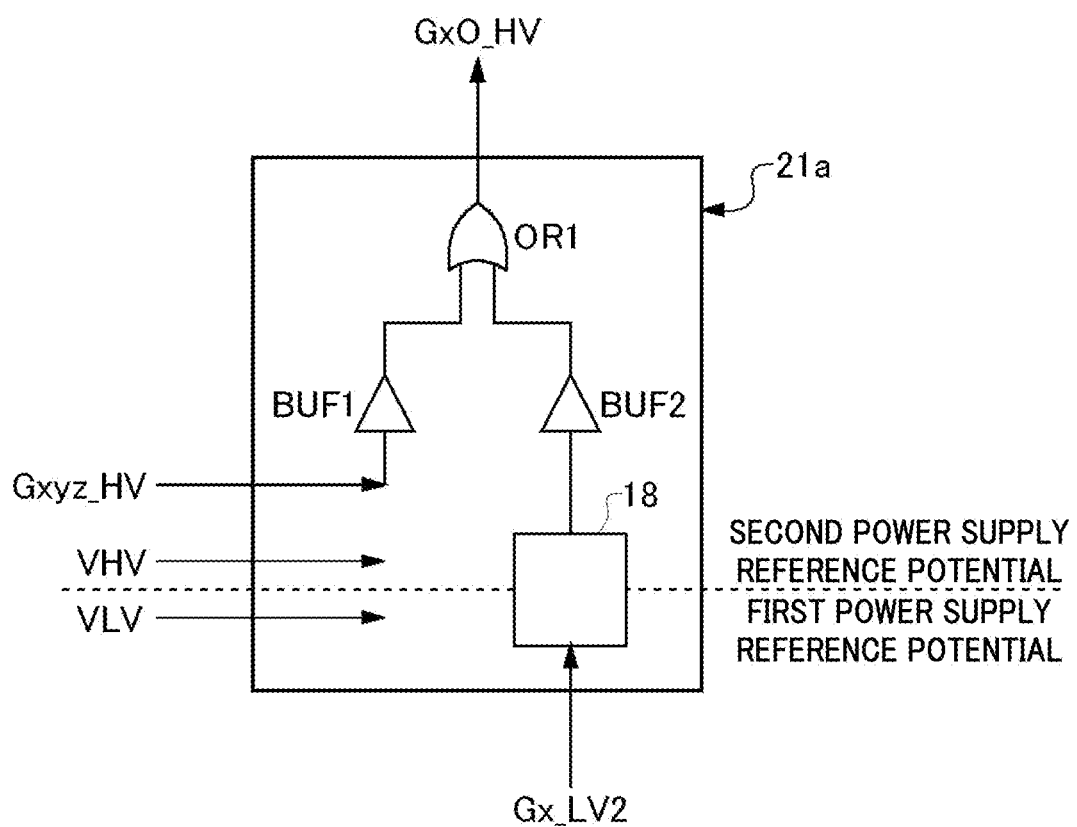
FIG. 8 illustrates one example of the gate driving circuit according to the present embodiment.

FIG. 8 illustrates one example of the gate driving circuit 21 according to the present embodiment. In this figure, the configuration of the gate driving circuit 21a will be described as a representative from among the gate driving circuits 21a-c. The gate driving circuit 21b and the gate driving circuit 21c may be configured in the same manner. The gate driving circuit 21a includes an isolation circuit 18, a buffer BUF1, a buffer BUF2, and a logic sum device OR1.

The isolation circuit 18 includes an isolation transformer or a photocoupler, for example. The isolation circuit 18 receives a power supply voltage VLV and a power supply voltage VHV to convert the gate driving instruction Gx_LV2 which refers to the ground GND_N1 as the reference potential, into a gate driving instruction which refers to the ground GND_N2 as the reference potential.

The buffer BUF1 shapes and outputs the gate driving instruction Gxyz_HV which refers to the ground GND_N2 as the reference potential. The buffer BUF2 shapes and outputs the gate driving instruction converted from the gate driving instruction Gx_LV2. The logic sum device OR1 outputs a logic sum of the output of the buffer BUF1 and the output of the buffer BUF2. This allows the logic sum device OR1 to output the gate driving instruction GxO_HV which refers to the ground GND_N2 as the reference potential, where the gate driving instruction GxO_HV is logic H if at least one of the gate driving instruction Gxyz_HV from the second fail safe circuit 14 and the gate driving instruction Gx_LV2 from the first fail safe circuit 8 is logic H, and is logic L if both of them are logic L. This allows the isolation circuit 18 to convey to the lower-arm-side switching device 5a a gate driving instruction in accordance with the gate driving instruction Gx_LV1 from the control circuit 7 during the normal operation and to convey to the lower-arm-side switching device 5a the gate driving instruction Gxyz_HV from the second fail safe circuit 14 if the auxiliary battery 6 is lost.

Figure 9:
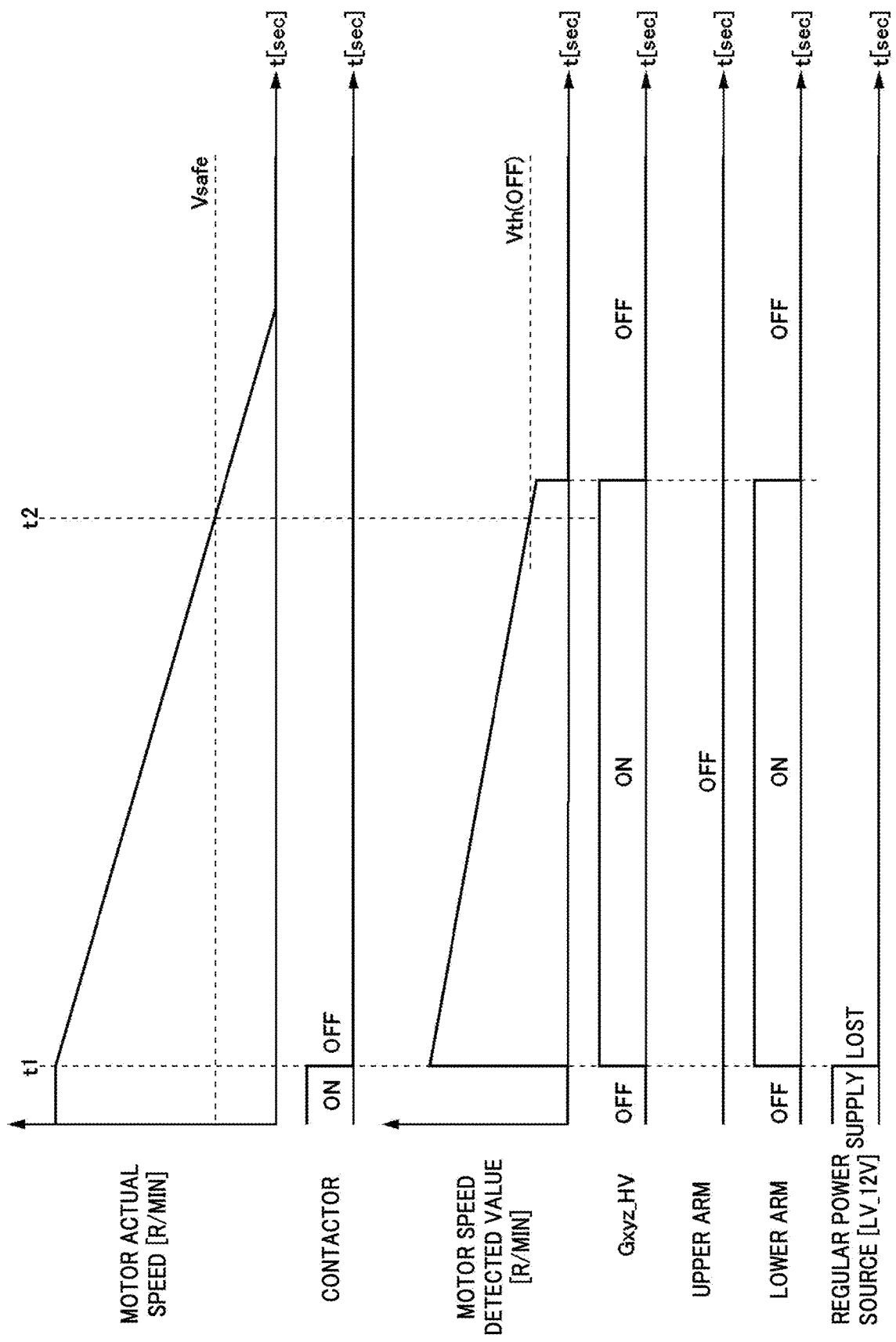
FIG. 9 illustrates one example of an operation waveform of the electromechanical system according to the present embodiment.

FIG. 9 illustrates one example of an operation waveform of the electromechanical system according to the present embodiment. This figure illustrates, from the top to the bottom, temporal changes of the actual speed of the motor (the number of rotation per minute), a state of a contactor (switch 2), the value of the speed of the motor detected by the speed detection unit 22 (that is, a voltage of the detection signal N_det), the gate driving instruction Gxyz_HV output by the second fail safe circuit 14, the state of the upper-arm-side switching devices 4a-c, the state of the lower-arm-side switching devices 5a-c, and the state of the regular power source (auxiliary battery 6).

At the time t1, if the auxiliary battery 6 is lost due to an accident or failure, for example, the electromechanical system 200 senses it and switches the switch 2 from the ON state to the OFF state. In addition, the power supply voltage VHV_1 falls down to the threshold voltage or below in response to the auxiliary battery 6 being lost. Thus, in the second fail safe circuit 14 illustrated in FIG. 7, the comparator CMP3 outputs logic H and the logic product device AND1 outputs the gate driving instruction Gxyz_HV of logic H while the detection signal N_det exceeds the threshold voltage Vth. Note that, even if the switch 2 is turned into the OFF state, the power supply circuit 13 can continue to supply the power supply voltage VHV_2 by use of a power charged in the DC bus line capacitor 3.

As the upper-arm gate driving circuits 12a-c are powered by the auxiliary battery 6, the loss of the auxiliary battery 6 disables them to drive the upper-arm-side switching devices 4a-c. Thus, the upper-arm-side switching devices 4a-c are turned into the OFF state. The gate driving circuits 21a-c receive the redundant power supply voltage VHV to perform a fail safe control in response to the gate driving instruction Gxyz_HV being logic H, to turn all of the lower-arm-side switching devices 5a-c into the ON state. If all of the lower-arm-side switching devices 5a-c are in the ON state and the motor PM is in the winding short circuit state, a braking force acts on the motor PM such that the number of rotation of the motor is decreased.

At the time t2, if the rotation speed of the motor PM falls down to the rotation speed Vsafe or below, the detection signal N_det falls down to the threshold voltage Vth or below, where the rotation speed Vsafe is the lower limit for performing the fail safe control and the threshold voltage Vth is preset correspondingly to the rotation speed Vsafe. Thus, the output of the comparator CMP2 changes from logic H to logic L, and the gate driving signal Gxyz_HV output by the logic product device AND1 changes from logic H to logic L. Following these changes, the gate driving circuits 21a-c turn the gate driving instructions GxO_HV, GyO_HV, and GzO_HV into logic L while turning the lower-arm-side switching devices 5a-c into the OFF state.

As set forth above, the second fail safe circuit 14 can perform, even if the auxiliary battery 6 is lost, a fail safe control on the gate driving circuits 21a-c powered by the power supply circuit 13 by use of the detection signal N_det from the speed detection unit 22 which is powered by the power supply circuit 13 to detect a rotation of the motor PM. In addition, even if a power supply from the main battery 1 and the DC bus line capacitor 3 is lost, the first fail safe circuit 8 can perform a similar fail safe control on the upper-arm gate driving circuits 12a-c powered by the auxiliary battery 6, by use of the speed sensor 101 which is powered by the auxiliary battery 6 to detect a rotation of the motor PM.

Figure 10:
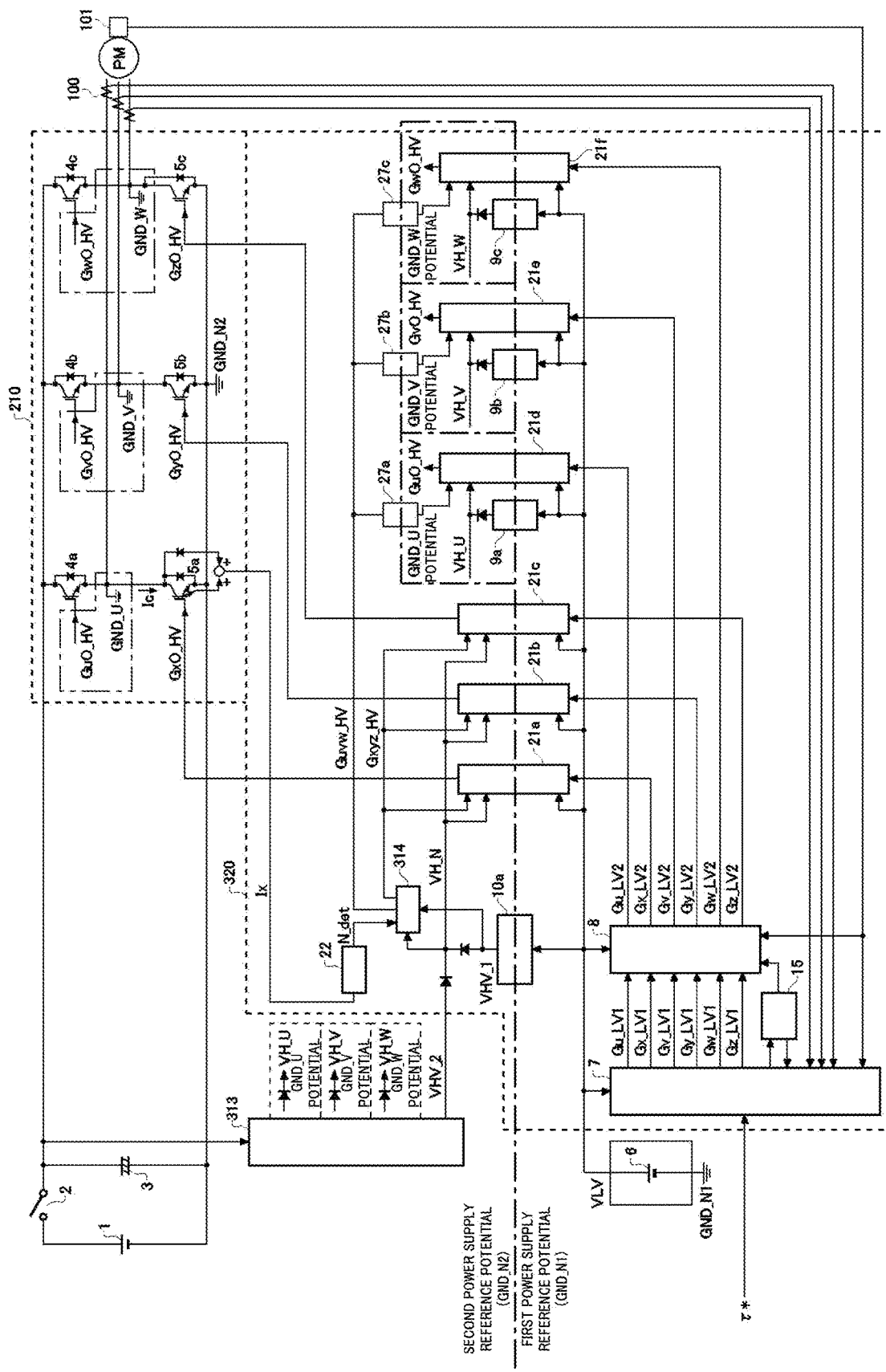
FIG. 10 illustrates an electromechanical system according to a modification example of the present embodiment.

FIG. 10 illustrates an electromechanical system 300 according to a modification example of the present embodiment. The electromechanical system 300 is a modification example of the electromechanical system 200 illustrated in FIG. 1, and hereinafter the description will thus be omitted, aside from the difference.

The electromechanical system 300 uses gate driving circuits 21d-f with a redundant power source such that the gates of the upper-arm-side switching devices 4a-c can be driven even if the auxiliary battery 6 is lost. This allows the electromechanical system 300 to perform a fail safe control to alternately turn on all of the upper-arm-side switching devices 4a-c and all of the lower-arm-side switching devices 5a-c, if the auxiliary battery 6 is lost.

The electromechanical system 300 includes a main battery 1, a switch 2, a DC bus line capacitor 3, an auxiliary battery 6, a power supply circuit 313, a motor PM, one or more current sensors 100, a speed sensor 101, an inverter 210, and a motor driving apparatus 320. Here, the main battery 1, the switch 2, the DC bus line capacitor 3, the auxiliary battery 6, the motor PM, one or more current sensors 100, the speed sensor 101, and the inverter 210 are similar to the components of the electromechanical system 200 which are indicated by the same reference signs, as illustrated in FIG. 1, and the description thereof will thus be omitted.

The power supply circuit 313 is connected between the DC bus lines, in the same manner as the power supply circuit 13, and outputs a voltage VHV_2 which is decreased from the voltage of the DC bus line at the positive side. In addition, the power supply circuit 313 outputs a power supply voltage VH_U which refers to the ground GND_U as the reference potential, a power supply voltage VH_V which refers to the ground GND_V as the reference potential, and a power supply voltage VH_W which refers to the ground GND_W as the reference potential. The power supply circuit 313 may have, as one example, an isolated DC/DC converter including an isolation transformer, for example, in order to generate each of the power supply voltages VH_U, VH_V, and VH_W.

The motor driving apparatus 320 is connected to the inverter 210, in the same manner as the motor driving apparatus 220, and is powered by the power supply circuit 313 and the auxiliary battery 6 to control the inverter 210. The motor driving apparatus 320 includes a control circuit 7, a first fail safe circuit 8, a failure detection circuit 15, a plurality of upper-arm power supply circuits 9a-c, a lower-arm power supply circuit 10, a speed detection unit 22, a second fail safe circuit 314, a plurality of isolation circuits 27a-c, a plurality of gate driving circuits 21a-c, and a plurality of gate driving circuits 21d-f. Here, the control circuit 7, the first fail safe circuit 8, the failure detection circuit 15, a plurality of the upper-arm power supply circuits 9a-c, the lower-arm power supply circuit 10, the speed detection unit 22, and a plurality of the gate driving circuits 21a-c are similar to the components of the motor driving apparatus 220 which are indicated by the same reference signs, as illustrated in FIG. 1, and the description thereof will thus be omitted.

The second fail safe circuit 314 is connected to the speed detection unit 22 and powered at least by the second power source. In this modified example, the second fail safe circuit 314 is powered by the power supply voltage VHV. The second fail safe circuit 314 performs, by use of the detection signal N_det from the speed detection unit 22, a fail safe control on the gate driving circuits 21a-f at least powered by the power supply circuit 13.

In this modified example, the second fail safe circuit 314 receives the power supply voltage VHV_1 input from the lower-arm power supply circuit 10 to detect that a power supply from the auxiliary battery 6 is lost, in response to the power supply voltage VHV_1 falling down to the lower limit voltage or below. Then, the second fail safe circuit 314 performs, if a power supply from the auxiliary battery 6 is lost, a fail safe control on the gate driving circuits 21a-c. The second fail safe circuit 314 sets the gate driving instruction Gxyz_HV to be logic L during the normal operation. In the fail safe control, if the rotation speed of the motor PM is equal to or greater than the threshold, the second fail safe circuit 314 alternately switches the gate driving instruction Gxyz_HV between logic H and logic L so as to alternately turn on and off all of the lower-arm-side switching devices 5a-c.

The second fail safe circuit 314 may further output a gate driving instruction Guvw_HV, as illustrated in FIG. 10, to perform a fail safe control on the gate driving circuits 21d-f. The second fail safe circuit 314 sets the gate driving instruction Gxyz_HV and the gate driving instruction Guvw_HV to be logic L during the normal operation. In the fail safe control, if the rotation speed of the motor PM is equal to or greater than the threshold, the second fail safe circuit 314 alternately switches the gate driving instruction Gxyz_HV between logic H and logic L, and sets the gate driving instruction Guvw_HV to be a logic negation of the gate driving instruction Gxyz_HV so as to alternately turn on all of the upper-arm-side switching devices 4a-c and all of the lower-arm-side switching devices 5a-c. As one example, the second fail safe circuit 314 may include: the second fail safe circuit 14; and a control circuit which sets the gate driving instruction Gxyz_HV and the gate driving instruction Guvw_HV to be logic L, if the logic product device AND1 of the second fail safe circuit 14 outputs logic L, and which alternately sets the gate driving instruction Gxyz_HV and the gate driving instruction Guvw_HV to be logic H, if the logic product device AND1 of the second fail safe circuit 14 outputs logic H.

Each of the isolation circuits 27a-c receives a gate driving signal Guvw_HV which refers to the ground GND_N2 as the reference potential, and converts the gate driving signal Guvw_HV into a signal which refers to the ground GND_U as the reference potential, a signal which refers to the ground GND_V as the reference potential, and a signal which refers to the ground GND_W as the reference potential, respectively. Each of the isolation circuits 27a-c transmits the gate driving signal Guvw_HV while isolating the side of the ground GND_N2 from the side of the ground GND_U, the ground GND_V, and the ground GND_W, by an isolation device such as a photocoupler.

The gate driving circuits 21d-f function as the upper-arm gate driving circuit. The gate driving circuits 21d-f may be configured in the same manner as the gate driving circuit 21a illustrated in FIG. 8. The gate driving circuit 21d is connected to the first fail safe circuit 8 and the isolation circuit 27a, and receives the power supply voltage VLV (which refers to the ground GND_N1 as the reference potential) from the auxiliary battery 6 and the power supply voltage VH_U (which refers to the ground GND_U as the reference potential) from the power supply circuit 313 and the upper-arm power supply circuit 9a. Here, the power supply voltage from the power supply circuit 313 and the power supply voltage from the upper-arm power supply circuit 9a are merged, for example, through rectifier devices such as rectifier diodes, respectively, to be the power supply voltage VH_U. This allows the power supply voltage VHV_U to be redundant so that it is not lost even if either of the power supply voltage from the power supply circuit 313 or the power supply voltage from the upper-arm power supply circuit 9a is lost.

The gate driving circuit 21d outputs to the upper-arm-side switching device 4a a gate driving instruction GuO_HV to switch the upper-arm-side switching device 4a between on and off based on the gate driving instruction Gu_LV2 from the first fail safe circuit 8, if the gate driving instruction Guvw_HV from the isolation circuit 27a is logic L, and to turn on the upper-arm-side switching device 4a if the gate driving instruction Guvw_HV is logic H. Here, the gate driving instruction Guo_HV is a signal which refers to the ground GND_U as the reference potential. The gate driving circuits 21e-f have a similar function.

According to this modified example, the electromechanical system 300, the gate driving circuits 21a-c for the upper arm and the gate driving circuits 21d-f for the lower arm are powered by the auxiliary battery 6 and by the main battery 1 and the DC bus line capacitor 3. This allows the electromechanical system 300 to perform a fail safe control, even if the auxiliary battery 6 is lost, by use of the gate driving circuits 21a-f to alternately turning on all of the upper-arm-side switching devices 4a-c and all of the lower-arm-side switching devices 5a-c, thereby expediting consumption of the power accumulated in the DC bus line capacitor 3.

Figure 11:
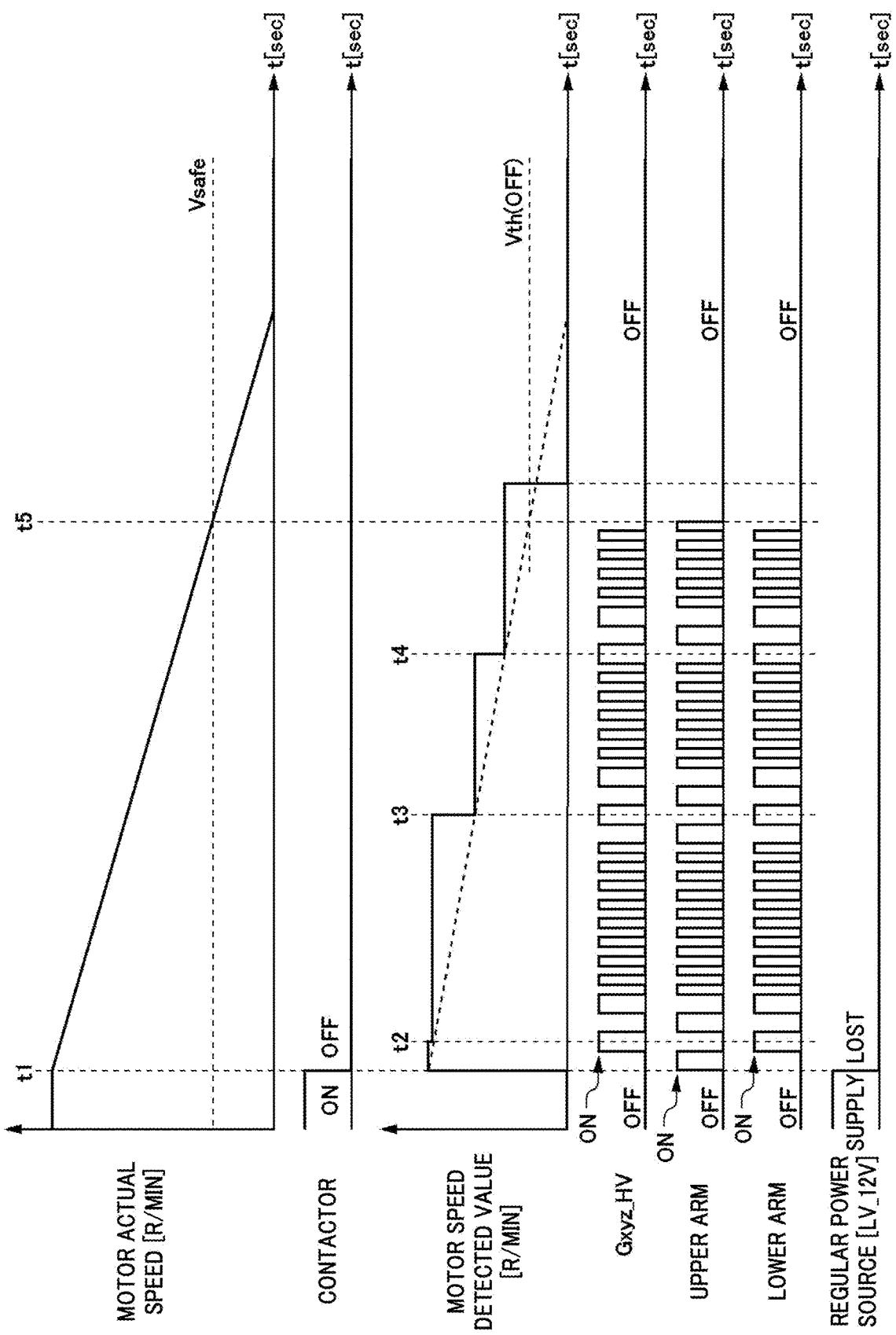
FIG. 11 illustrates a first example of the operation waveform of the electromechanical system according to the modification example of the present embodiment.

FIG. 11 illustrates a first example of the operation waveform of the electromechanical system 300. This figure illustrates, from the top to the bottom, temporal changes of the actual speed of the motor (the number of rotation per minute), a state of a contactor (switch 2), the value of the speed of the motor detected by the speed detection unit 22 (that is, a voltage of the detection signal N_det), the gate driving instruction Gxyz_HV output by the second fail safe circuit 314, the state of the upper-arm-side switching devices 4a-c, the state of the lower-arm-side switching devices 5a-c, and the state of the regular power source (auxiliary battery 6).

At the time t1, if the auxiliary battery 6 is lost due to an accident or a failure, for example, the electromechanical system 300 senses it and switches the switch 2 from the ON state to the OFF state. In addition, the power supply voltage VHV_1 falls down to the threshold voltage or below in response to the auxiliary battery 6 being lost. Thus, under the condition that the detection signal N_det exceeds the threshold voltage Vth, the second fail safe circuit 314 performs a fail safe control to alternately turn on all of the gate driving instructions Guvw_HV and the gate driving instruction Gxyz_HV.

In the present example, the speed detection unit 22 senses, in the fail safe control, the current detection signal from the lower-arm-side switching device 5a every predetermined period or not periodically, while the lower-arm-side switching device 5a is on. Here, the second fail safe circuit 314 may set the duration for which all of the lower-arm-side switching devices 5a-c are turned on if the speed detection unit 22 senses the current detection signal to be longer than the duration for which all of the lower-arm-side switching devices 5a-c are turned on if the speed detection unit 22 does not sense the current detection signal.

For example, at the time t2, the speed detection unit 22 senses the current detection signal while the gate driving instruction Gxyz_HV is logic H. Thus, the second fail safe circuit 314 may set the duration for which all of the lower-arm-side switching devices 5a-c are turned on at the time t2 to be longer than the duration for which all of the lower-arm-side switching devices 5a-c are turned on if the current detection signal is not sensed between the time t2 and the time t3 at which the next current detection signal is sensed. Here, the second fail safe circuit 314 may set the duration for which all of the lower-arm-side switching devices 5a-c are turned on if the speed detection unit 22 senses the current detection signal to be longer than all of the durations for which all of the lower-arm-side switching devices 5a-c are turned on if the speed detection unit 22 does not sense the current detection signal, or to be longer than at least one duration for which all of the lower-arm-side switching devices 5a-c are turned on if the speed detection unit 22 does not sense the current detection signal as illustrated in FIG. 11. Note that the second fail safe circuit 314 may set, as illustrated in this figure, a frequency at which all of the upper-arm-side switching devices 4a-c and all of the lower-arm-side switching devices 5a-c are alternately turned on repeatedly in the duration including the timing at which the current detection signal is sensed to be lower than a frequency at which all of the upper-arm-side switching devices 4a-c and all of the lower-arm-side switching devices 5a-c are alternately turned on repeatedly in the duration not including the timing at which the current detection signal is sensed. At the times t3 and t4, the speed detection unit 22 senses the current detection signal from the lower-arm-side switching device 5a while the lower-arm-side switching device 5a is turned on, in the same manner as the time t2.

At the time t5, if the rotation speed of the motor PM falls down to the rotation speed Vsafe or below, the detection signal N_det falls down to the threshold voltage Vth or below, where the rotation speed Vsafe is the lower limit for performing the fail safe control and the threshold voltage Vth is preset in accordance with the rotation speed Vsafe. Thus, the second fail safe circuit 314 terminates the fail safe control for alternately turning on all of the upper-arm-side switching devices 4a-c and all of the lower-arm-side switching devices 5a-c.

This allows the second fail safe circuit 314 to ensure a longer time until the speed detection unit 22 senses the current detection signal after all of the lower-arm-side switching devices 5a-c are turned on, thereby sensing the current detection signal after the current detection signal transits to the more stable state after the switch of the lower-arm-side switching devices 5a-c. Thus, even if all of the upper-arm-side switching devices 4a-c and all of the lower-arm-side switching devices 5a-c are alternately turned on at a high speed so as to discharge the DC bus line capacitor 3 rapidly, the speed detection unit 22 can sense the current detection signal after noises due to the switching are decreased. Note that if the speed detection unit 22 detects a current which flows through at least one of the upper-arm-side switching devices 4a-c, in the fail safe control, the second fail safe circuit 314 may set the duration for which all of the upper-arm-side switching devices 4a-c are turned on if the speed detection unit 22 senses the current detection signal to be longer than the duration for which all of the upper-arm-side switching devices 4a-c are turned on if the speed detection unit 22 does not sense the current detection signal.

Figure 12:
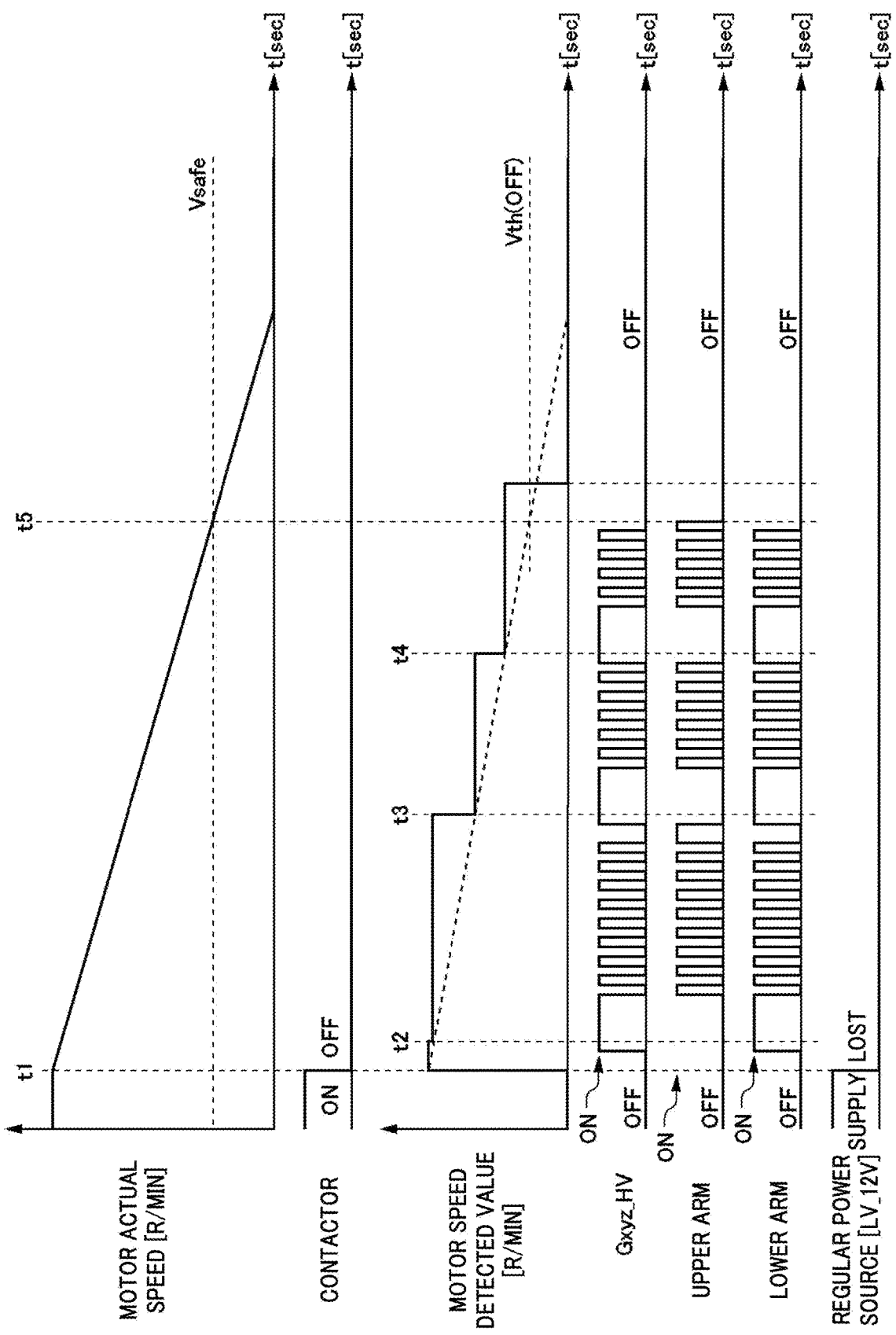
FIG. 12 illustrates a second example of the operation waveform of the electromechanical system according to the modification example of the present embodiment.

FIG. 12 illustrates a second example of the operation waveform of the electromechanical system 300. In the example of this figure, the gate driving instruction Gxyz_HV output by the second fail safe circuit 314, the state of the upper-arm-side switching devices 4a-c, and temporal changes of the state of the lower-arm-side switching devices 5a-c are different from those of FIG. 11, and the description thereof will mainly be provided below.

In the present example, in the fail safe control, the second fail safe circuit 314 may set the duration for which all of the lower-arm-side switching devices 5*a-c* are turned on if the speed detection unit 22 senses the current detection signal to be longer than the duration for which all of the lower-arm-side switching devices 5*a-c* are turned on if the speed detection unit 22 does not sense the current detection signal. In the example of this figure, at the times t2, t3 and t4, the duration for which all of the lower-arm-side switching devices 5*a-c* are turned on if the speed detection unit 22 senses the current detection signal is maintained to be longer than the other duration for which all of the lower-arm-side switching devices 5*a-c* are turned on and each duration for which all of the upper-arm-side switching devices 4*a-c* are turned on.

This allows the second fail safe circuit 314, in the same manner as FIG. 11, to ensure a longer time until the speed detection unit 22 senses the current detection signal after all of the lower-arm-side switching devices 5*a-c* are turned on, thereby sensing the current detection signal after the current detection signal transits to the more stable state after the switch of the lower-arm-side switching devices 5*a-c*. Note that if the speed detection unit 22 detects a current which flows through at least one of the upper-arm-side switching devices 4*a-c*, in the fail safe control, the second fail safe circuit 314 may set the duration for which all of the upper-arm-side switching devices 4*a-c* are turned on if the speed detection unit 22 senses the current detection signal to be longer than the duration for which all of the upper-arm-side switching devices 4*a-c* are turned on if the speed detection unit 22 does not sense the current detection signal.

Figure 13:
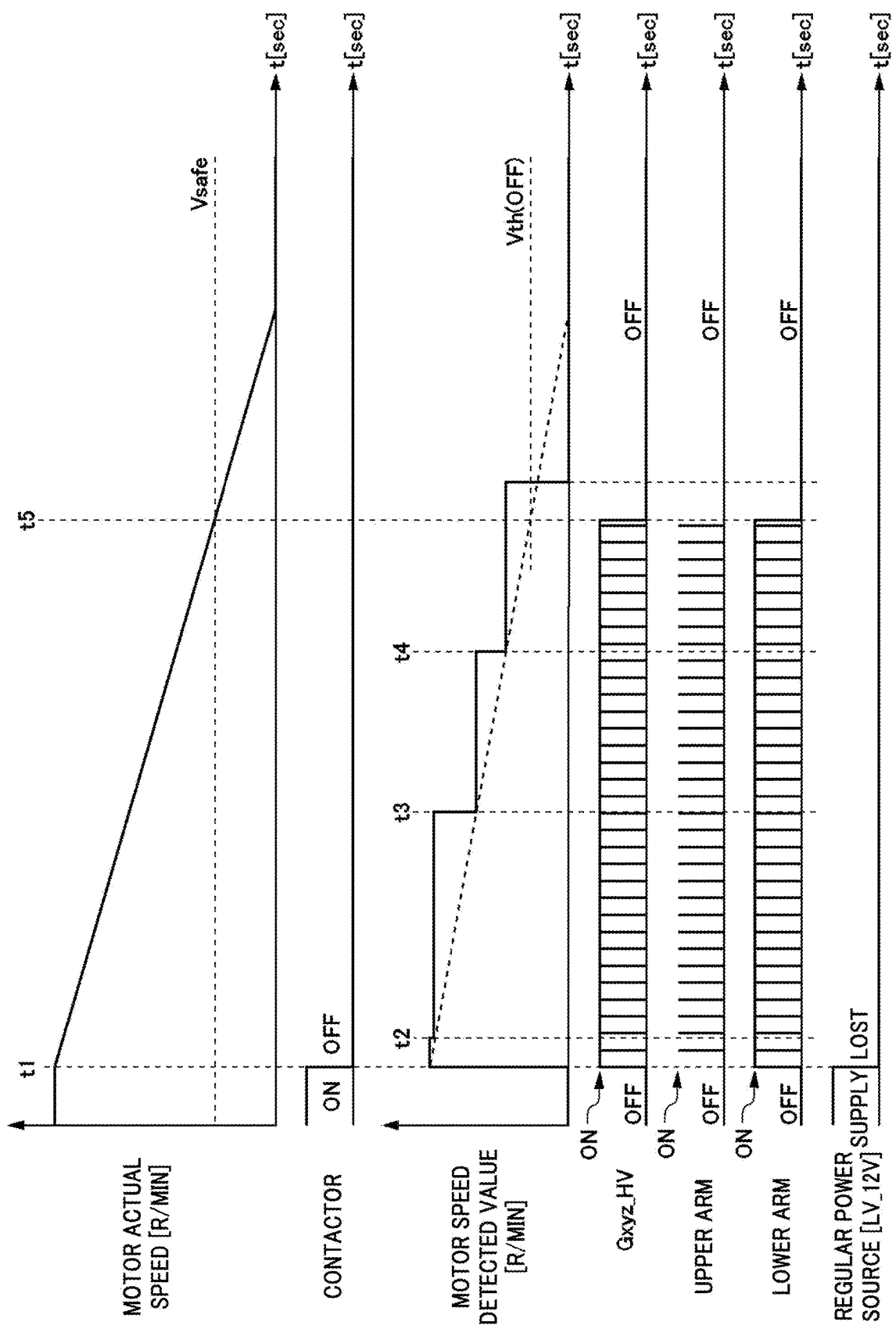
FIG. 13 illustrates a third example of the operation waveform of the electromechanical system according to the modification example of the present embodiment.

FIG. 13 illustrates a third example of the operation waveform of the electromechanical system 300. In the example of this figure, the gate driving instruction Gxyz_HV output by the second fail safe circuit 314, the state of the upper-arm-side switching devices 4*a-c*, and temporal changes of the state of the lower-arm-side switching devices 5*a-c* are different from those of FIG. 11 and FIG. 12, and the description thereof will mainly be provided below.

In the present example, in the fail safe control, the second fail safe circuit 314 sets the duration for which all of the lower-arm-side switching devices 5*a-c* are turned on if the speed detection unit 22 senses the current detection signal to be longer than the duration for which all of the upper-arm-side switching devices 4*a-c* are turned on. In the example of this figure, in the fail safe control, each duration for which all of the upper-arm-side switching devices 4*a-c* are turned on has, as one example, substantially the same time length, and each duration for which all of the lower-arm-side switching devices 5*a-c* are turned on has, as one example, substantially the same time length and is greater than each duration for which all of the upper-arm-side switching devices 4*a-c* are turned on.

This allows the second fail safe circuit 314, in the same manner as FIG. 11 and FIG. 12, to ensure a longer time until the speed detection unit 22 senses the current detection signal after all of the lower-arm-side switching devices 5*a-c* are turned on, thereby sensing the current detection signal after the current detection signal transits to the more stable state after the switch of the lower-arm-side switching devices 5*a-c*. Note that if the speed detection unit 22 detects a current which flows through at least one of the upper-arm-side switching devices 4*a-c*, in the fail safe control, the second fail safe circuit 314 may set the duration for which all of the lower-arm-side switching devices 5*a-c* are turned on if the speed detection unit 22 senses the current detection signal to be longer than the duration for which all of the upper-arm-side switching devices 4*a-c* are turned on.

Aside from the fail safe control of FIG. 11 to FIG. 13, or in combination with the fail safe control of FIG. 11 to FIG. 13, if a power supply from the main battery 1, the DC bus line capacitor 3, or the power supply circuit 313 has been lost or is being lost, the electromechanical system 300 may also enable the first fail safe circuit 8, in the same manner as the second fail safe circuit 314, to perform the fail safe control to alternately turn on all of the upper-arm-side switching devices 4*a-c* and all of the lower-arm-side switching devices 5*a-c*.

In addition, the speed detection unit 22 may detect the rotation of the motor PM while the lower-arm-side switching device 5*a* is off, based on the current detection signal from the lower-arm-side switching device 5*a*, as described in relation to FIG. 5 and FIG. 6. In this case, instead of setting the duration for which all of the lower-arm-side switching devices 5*a-c* is turned on if the speed detection unit 22 senses the current detection signal to be longer in FIG. 11 to FIG. 13, the second fail safe circuit 314 may also set the duration for which all of the lower-arm-side switching devices 5*a-c* are turned off if the speed detection unit 22 senses the current detection signal to be longer.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A motor driving apparatus comprising:
    an upper-arm gate driving circuit that drives a gate of an upper-arm-side switching device of an inverter for driving a motor;
    a lower-arm gate driving circuit that drives a gate of a lower-arm-side switching device of the inverter;
    a first rotation detection unit powered by a first power source to detect a rotation of the motor;
    a second rotation detection unit powered by a second power source to detect a rotation of the motor;
    a first fail safe circuit that performs, by use of a detection signal from the first rotation detection unit, a fail safe control on a gate driving circuit powered at least by the first power source, from among the upper-arm gate driving circuit and the lower-arm gate driving circuit; and
    a second fail safe circuit that performs, by use of a detection signal from the second rotation detection unit, a fail safe control on a gate driving circuit powered at least by the second power source, from among the upper-arm gate driving circuit and the lower-arm gate driving circuit, wherein the second fail safe circuit is connected to the second rotation detection unit and at least one of the upper-arm gate driving circuit and the lower-arm gate driving circuit.

2. The motor driving apparatus according to claim 1, wherein the second power source is isolated from the first power source.

3. The motor driving apparatus according to claim 1, wherein the inverter includes a DC bus line connected to the second power source.

4. The motor driving apparatus according to claim 3, wherein
the first fail safe circuit is powered at least by the first power source, and
the second fail safe circuit is powered at least by the second power source.

5. The motor driving apparatus according to claim 4, wherein
if a power supply from the first power source is lost, the second fail safe circuit is powered by the second power source and performs a fail safe control on a gate driving circuit powered at least by the second power source, from among the upper-arm gate driving circuit and the lower-arm gate driving circuit.

6. The motor driving apparatus according to claim 4, wherein
the second rotation detection unit detects a rotation of the motor based on a current detection signal from a current detection terminal of the upper-arm-side switching device or the lower-arm-side switching device.

7. The motor driving apparatus according to claim 6, wherein
the second rotation detection unit detects a rotation of the motor based on the current detection signal from the current detection terminal of the lower-arm-side switching device, and
the second fail safe circuit performs, in the fail safe control:
alternately turning on and off all of a plurality of the lower-arm-side switching devices; and
setting a duration for which all of the plurality of lower-arm-side switching devices are turned on if the second rotation detection unit senses the current detection signal to be longer than a duration for which all of the plurality of lower-arm-side switching devices are turned on if the second rotation detection unit does not sense the current detection signal.

8. The motor driving apparatus according to claim 6, wherein
the second rotation detection unit detects a rotation of the motor based on the current detection signal from the current detection terminal of the lower-arm-side switching device,
at least one of the first fail safe circuit and the second fail safe circuit performs, in the fail safe control:
alternately turning on all of a plurality of the upper-arm-side switching devices and all of a plurality of the lower-arm-side switching devices; and
setting a duration for which all of the plurality of lower-arm-side switching devices are turned on if the second rotation detection unit senses the current detection signal to be longer than a duration for which all of the plurality of upper-arm-side switching devices are turned on.

9. The motor driving apparatus according to claim 6, wherein
at least one of the first fail safe circuit and the second fail safe circuit performs, in the fail safe control:
alternately turning on all of a plurality of the upper-arm-side switching devices and all of a plurality of the lower-arm-side switching devices; and
if a rotation speed of the motor detected by the first rotation detection unit or the second rotation detection unit is decreased, decreasing a frequency for alternately turning on all of a plurality of the upper-arm-side switching devices and all of a plurality of the lower-arm-side switching devices.

10. A motor driving method comprising:
detecting a rotation of a motor by a first rotation detection unit powered by a first power source;
detecting a rotation of the motor by a second rotation detection unit powered by a second power source;
performing, by a first fail safe circuit, by use of a detection signal from the first rotation detection unit, a fail safe control on a gate driving circuit powered at least by the first power source, from among an upper-arm gate driving circuit and a lower-arm gate driving circuit, wherein the upper-arm gate driving circuit drives a gate of an upper-arm-side switching device of an inverter for driving the motor and the lower-arm gate driving circuit drives a gate of a lower-arm-side switching device of the inverter; and
performing, by a second fail safe circuit, by use of a detection signal from the second rotation detection unit, a fail safe control on a gate driving circuit powered at least by the second power source, from among the upper-arm gate driving circuit and the lower-arm gate driving circuit, wherein
the second fail safe circuit is connected to the second rotation detection unit and at least one of the upper-arm gate driving circuit and the lower-arm gate driving circuit.

11. The motor driving method according to claim 10, wherein the second power source is isolated from the first power source.

12. The motor driving method according to claim 10, wherein the inverter includes a DC bus line connected to the second power source.

13. The motor driving method according to claim 12, wherein
the first fail safe circuit is powered at least by the first power source, and
the second fail safe circuit is powered at least by the second power source.

14. The motor driving method according to claim 13, wherein
if a power supply from the first power source is lost, the second fail safe circuit is powered by the second power source and performs a fail safe control on a gate driving circuit powered at least by the second power source, from among the upper-arm gate driving circuit and the lower-arm gate driving circuit.

15. The motor driving method according to claim 14, wherein
the second rotation detection unit detects a rotation of the motor based on a current detection signal from a current detection terminal of the upper-arm-side switching device or the lower-arm-side switching device.

16. The motor driving method according to claim 15, wherein the second rotation detection unit detects a rotation of the motor based on the current detection signal from the current detection terminal of the lower-arm-side switching device, and the second fail safe circuit performs, in the fail safe control:

alternately turning on and off all of a plurality of the lower-arm-side switching devices; and setting a duration for which all of the plurality of lower-arm-side switching devices are turned on if the second rotation detection unit senses the current detection signal to be longer than a duration for which all of the plurality of lower-arm-side switching devices are turned on if the second rotation detection unit does not sense the current detection signal.

17. The motor driving method according to claim 15, wherein the second rotation detection unit detects a rotation of the motor based on the current detection signal from the current detection terminal of the lower-arm-side switching device, at least one of the first fail safe circuit and the second fail safe circuit performs, in the fail safe control:

alternately turning on all of a plurality of the upper-arm-side switching devices and all of a plurality of the lower-arm-side switching devices; and setting a duration for which all of the plurality of lower-arm-side switching devices are turned on if the second rotation detection unit senses the current detection signal to be longer than a duration for which all of the plurality of upper-arm-side switching devices are turned on.

18. The motor driving method according to claim 15, wherein at least one of the first fail safe circuit and the second fail safe circuit performs, in the fail safe control:

alternately turning on all of a plurality of the upper-arm-side switching devices and all of a plurality of the lower-arm-side switching devices; and if a rotation speed of the motor detected by the first rotation detection unit or the second rotation detection unit is decreased, decreasing a frequency for alternately turning on all of a plurality of the upper-arm-side switching devices and all of a plurality of the lower-arm-side switching devices.

19. The motor driving apparatus according to claim 1, wherein the upper-arm-side switching device and the lower-arm-side switching device are connected with each other in series between a positive side bus line and a negative side bus line of the second power source, at least one of the upper-arm-side switching device and the lower-arm-side switching device includes a current detection terminal that drives current for current detection in accordance with current flowing between a main terminal of the lower-arm-side switching device and a main terminal of the upper-arm-side switching device, and the second rotation detection unit is connected to the current detection terminal.

20. The motor driving method according to claim 10, wherein the upper-arm-side switching device and the lower-arm-side switching device are connected with each other in series between a positive side bus line and a negative side bus line of the second power source, at least one of the upper-arm-side switching device and the lower-arm-side switching device includes a current detection terminal that drives current for current detection in accordance with current flowing between a main terminal of the lower-arm-side switching device and a main terminal of the upper-arm-side switching device, and the second rotation detection unit is connected to the current detection terminal.

* * * * *